United States Patent
Yamashita et al.

(10) Patent No.: US 8,319,706 B2
(45) Date of Patent: *Nov. 27, 2012

(54) DISPLAY APPARATUS AND DRIVING METHOD WITH FIRST AND SECOND TIME CORRECTION OF PIXEL DRIVE TRANSISTOR

(75) Inventors: Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 1283 days.

This patent is subject to a terminal disclaimer.

(21) Appl. No.: 12/076,785

(22) Filed: Mar. 24, 2008

(65) Prior Publication Data

US 2008/0238955 A1    Oct. 2, 2008

(30) Foreign Application Priority Data

Mar. 26, 2007 (JP) ................. 2007-078219

(51) Int. Cl.
G09G 3/30 (2006.01)
(52) U.S. Cl. .............. 345/76; 345/83; 345/89; 345/204; 345/690; 315/169.1; 315/169.3
(58) Field of Classification Search .......... 345/36, 345/38–39, 45, 76–78, 82–84, 87–88, 98–100, 345/210–214, 690, 90–95, 204–205; 315/169.1, 315/169.3

See application file for complete search history.

(56) References Cited

U.S. PATENT DOCUMENTS

| 7,646,363 B2 * | 1/2010 | Yamashita et al. | 345/76 |
| 2004/0196223 A1 * | 10/2004 | Kwon | 345/82 |
| 2005/0269959 A1 * | 12/2005 | Uchino et al. | 315/169.3 |

FOREIGN PATENT DOCUMENTS

| JP | 2003-255856 A | 9/2003 |
| JP | 2003-271095 A | 9/2003 |
| JP | 2004-029791 A | 1/2004 |
| JP | 2004-093682 A | 3/2004 |
| JP | 2004-133240 A | 4/2004 |
| JP | 2006-215213 A | 8/2006 |

* cited by examiner

Primary Examiner — Lun-Yi Lao
Assistant Examiner — Olga Merkoulova
(74) Attorney, Agent, or Firm — Rader Fishman & Grauer, PLLC

(57) ABSTRACT

A display apparatus including a pixel array section, and a driving section configured to drive said pixel array section having pixels respectively including a drive transistor and light emitting element. A first time correction for the mobility of the drive transistor is applied, and then a second time correction for additional correction time is applied if the signal potential of an image signal is not high.

6 Claims, 17 Drawing Sheets

$$I_{ds} = k\mu(V_{gs} - V_{th})^2 = k\mu(V_{sig} - \Delta V)^2$$

DISPLAY APPARATUS AND DRIVING METHOD WITH FIRST AND SECOND TIME CORRECTION OF PIXEL DRIVE TRANSISTOR

CROSS REFERENCES TO RELATED APPLICATIONS

The present invention contains subject matter related to Japanese Patent Application JP 2007-078219 filed in the Japan Patent Office on Mar. 26, 2007, the entire contents of which being incorporated herein by reference.

BACKGROUND OF THE INVENTION

1. Field of the Invention

This invention relates to a display apparatus wherein a light emitting device disposed for each pixel is driven by current to display an image and a driving method for the display apparatus and an electronic apparatus using thereof. More particularly, the present invention relates to a driving method for a display apparatus of the active matrix type wherein the amount of current to be supplied to a light emitting device such as an organic EL device is controlled by a field effect transistor of the insulated gate type provided in each pixel circuit.

2. Description of the Related Art

In a display apparatus such as, for example, a liquid crystal display apparatus, a large number of liquid crystal pixels are arrayed in a matrix, and the intensity of transmission light or reflection light of incoming light is controlled for each pixel in response to image information to be displayed to display an image. Although this similarly applies to an organic EL display apparatus wherein an organic EL device is used in each pixel and so forth, the organic EL device is a self-luminous device different from the liquid crystal pixel. Therefore, the organic EL display apparatus is advantageous in that a display image thereof exhibits high visual observability, that no backlight is required and that the response speed is high. Further, the organic EL display apparatus is of the current-controlled type wherein the luminance level or gradation of each light emitting device can be controlled with the value of current to flow therethrough, and is much different in this regard from a display apparatus of the voltage-controlled type such as a liquid crystal display apparatus.

A simple matrix type driving system and an active matrix type driving system are available as a driving system for an organic EL display similarly to an LCD apparatus. Although the former system is simple in structure, it has a problem that it is not suitable to implement a display apparatus of a large size and a high definition. Therefore, development of the latter active matrix type driving system is proceeding energetically. In the active matrix type driving system, the current to flow through a light emitting device in the inside of each pixel circuit is controlled by an active device provided in the inside of each pixel circuit, usually a thin film transistor (TFT). Such an active matrix type driving system is disclosed, for example, in Japanese Patent Laid-Open No. 2003-255856 (hereinafter referred to as Patent Document 1), No. 2003-271095 (hereinafter referred to as Patent Document 2), No. 2004-133240 (hereinafter referred to as Patent Document 3), No. 2004-029791 (hereinafter referred to as Patent Document 4), No. 2004-093682 (hereinafter referred to as Patent Document 5) and No. 2006-215213 (hereinafter referred to as Patent Document 6).

SUMMARY OF THE INVENTION

A pixel circuit of the past is disposed at a location at which a scanning line extending in the direction of a row for supplying a control signal and a signal line extending in the direction of a column for supplying an image signal intersect with each other. The pixel circuit includes at least a sampling transistor, a pixel capacitor, a drive transistor and a light emitting device. The sampling transistor conducts in response to a control signal supplied from the scanning line to sample the image signal supplied from the signal line. The pixel capacitor retains an input voltage according to the signal potential of the sampled image signal. The drive transistor supplies output current as driving current in response to the input voltage retained in the pixel capacitor for a predetermined light emitting period. It is to be noted that usually the output current has dependency upon the carrier mobility and the threshold voltage of a channel region of the drive transistor. The light emitting device emits light with luminance according to the image signal with the output current supplied from the drive transistor.

The drive transistor receives, at the gate thereof, the input voltage retained in the pixel capacitor and supplies output current between the source and the drain thereof to energize the light emitting device. Usually, the luminance of emitted light of the light emitting device increases in proportion to the current flowing therethrough. Further, the output current supplying amount of the drive transistor is controlled with the gate voltage of the drive transistor, that is, with the input voltage written in the pixel capacitor. In the pixel circuit of the past, the input voltage to be applied to the gate of the drive transistor is varied in response to an input image signal to control the amount of current to be supplied to the light emitting device.

Here, the operation characteristic of the drive transistor is represented by the following expression (1):

$$Ids = (1/2)\mu(W/L)Cox(Vgs-Vth)^2 \qquad (1)$$

where Ids is the drain current flowing between the source and the drain of the drive transistor and is, in the pixel circuit, output current supplied to the light emitting device; Vgs is the gate voltage applied to the gate of the drive transistor with reference to the source and is, in the pixel circuit, the input voltage described hereinabove; Vth is the threshold voltage of the drive transistor; μ the mobility of a semiconductor thin film which forms the channel of the drive transistor; W the channel width; L the channel length; and Cox the gate capacitance. As apparent from the transistor characteristic expression (1), when the thin film transistor operates in a saturation region, if the gate voltage Vgs increases until it exceeds the threshold voltage Vth; then the transistor is placed into an on state and drain current Ids flows. In principle, if the gate voltage Vgs is fixed, then the drain current Ids of the normally same amount is supplied to the light emitting device as indicated by the transistor characteristic expression (1) given above. Accordingly, if image signals of the same level are supplied to the pixels which form the screen, then all pixels should emit light with the same luminance and uniformity of the screen should be obtained.

Actually, however, thin film transistors (TFTs) formed from a semiconductor thin film of polycrystalline silicon or the like have a dispersion in device characteristics. Particularly the threshold voltage Vth is not fixed but exhibits a dispersion among different pixels. As apparently seen from the transistor characteristic expression (1) given herein, if the threshold voltage Vth disperses among different drive transistors, then even if the gate voltage Vgs is fixed, a dispersion appears in the drain current Ids, resulting in dispersion of the luminance among the pixels. This damages the uniformity of the screen image. A pixel circuit which incorporates a function of canceling the dispersion in threshold voltage of drive transistors has been developed, and is disclosed, for example, in Patent Document 3 mentioned hereinabove.

However, the cause of the dispersion in output current to light emitting devices is not only the threshold voltage Vth of the drive transistors. As apparently seen from the transistor characteristic expression (1) given hereinabove, also where the mobility μ disperses among the drive transistors, the output current Ids varies. As a result, the uniformity of the screen image is damaged. A pixel circuit which incorporates a function of correcting the dispersion in mobility among drive transistors has been developed and is disclosed, for example, in Patent Document 6 mentioned hereinabove.

In the conventional pixel circuit which has a mobility correction function, driving current flowing through the drive transistor is negatively fed back to the pixel circuit within a predetermined correction period in response to the signal potential to adjust the signal potential retained in the pixel capacitor. As the mobility of the drive transistor increases, the negative feedback amount increases as much, and the decreasing amount of the signal potential increases. As a result, the driving current can be suppressed. On the other hand, as the mobility of the drive transistor decreases, the negative feedback amount to the pixel capacitor decreases as much, and consequently, the decreasing amount of the signal potential retained in the pixel capacitor decreases. Accordingly, the driving current does not decrease very much. In this manner, the signal potential is adjusted in response to the magnitude of the mobility of the drive transistor of each pixel in a direction in which the mobility is canceled. Therefore, although the mobility disperses among drive transistors of individual pixels, the individual pixels exhibit a substantially same level of luminance of emitted light in response to the same signal potential.

The mobility correction operation described above is carried out within a predetermined mobility correction period. In order to raise the uniformity of the screen image, it is significant to apply mobility correction in optimum conditions. However, the optimum mobility correction time is not always fixed, but actually relies upon the level of the image signal. Generally, there is a tendency that the optimum mobility correction time becomes shorter as the signal potential of the image signal rises, that is, when the luminance of emitted light is high and the white is to be displayed. On the contrary, when the signal potential is not high, that is, when display of a gray gradation or the black gradation is to be carried out, there is a tendency that the optimum mobility correction time becomes longer. However, the display apparatus of the past does not necessarily take into consideration the dependency of the optimum mobility correction time upon the signal potential of the image signal. This makes a subject to be solved in order to raise the uniformity of the screen image.

According to an embodiment of the present invention, there is provided a display apparatus, including:
a pixel array section; and
a driving section configured to drive the pixel array section;
the pixel array section including a plurality of first and second scanning lines extending in the direction of a row, a plurality of signal lines extending in the direction of a column, a plurality of pixels disposed in a matrix at intersecting locations of the first and second scanning lines and the signal lines, and a plurality of power supply lines and ground lines configured to supply power to the pixels;
the driving section including a first scanner configured to successively supply a first control signal to the first scanning lines to line sequentially scan the pixels in a unit of a row, a second scanner configured to successively supply a second control signal to the second scanning lines in synchronism with the line sequential scanning, and a signal selector configured to supply an image signal to the signal lines in synchronism with the line sequential scanning,
each of the pixels including a light emitting device, a sampling transistor, a drive transistor, a switching transistor, and a pixel capacitor,
the sampling transistor being connected at the gate thereof to one of the first scanning lines, at the source thereof to one of the signal lines and at the drain thereof to the gate of the drive transistor,
the drive transistor and the light emitting device being connected in series to form a current path between one of the power supply lines and one of the ground lines,
the switching transistor being inserted in the current path with the gate thereof connected to one of the second scanning lines,
the pixel capacitor being connected between the source and the gate of the drive transistor,
the sampling transistor being placed into an on state in response to the first control signal supplied from the first scanning line to sample the signal potential of the image signal supplied from the signal line and retain the sampled signal potential into the pixel capacitor,
the switching transistor being placed into an on state in response to the second control signal supplied from the second scanning line to place the current path into a conducting state,
the drive transistor supplying driving current in response to the signal potential retained in the pixel capacitor to the light emitting device through the current path placed in the conducting state,
the first scanner applying the first control signal to the first scanning line to turn on the sampling transistor to start sampling of the signal potential, whereafter the first scanner cancels the first control signal supplied to the first scanning line to turn off the sampling transistor, and
the second scanner being configured to apply, within an image signal writing period after the sampling transistor is turned on until the sampling transistor is turned off, the second control signal in the form of a pulse to the second scanning line so that the switching transistor exhibits an on state within predetermined correction time, apply first time correction for the mobility of the drive transistor to the signal potential retained in the pixel capacitor, and then apply, if the signal potential of the image signal is not high, second time correction for additional correction time at the last end of the image signal writing period to the signal potential retained in the pixel capacitor while prevent, if the signal potential of the image signal is high, application of the second time correction.

According to another embodiment of the present invention, there is provided a driving method for a display apparatus which includes a pixel array section and a driving section configured to drive the pixel array section;
the pixel array section including a plurality of first and second scanning lines extending in the direction of a row, a plurality of signal lines extending in the direction of a column, a plurality of pixels disposed in a matrix at intersecting locations of the first and second scanning lines and the signal lines, and a plurality of power supply lines and ground lines configured to supply power to the pixels;

the driving section including a first scanner configured to successively supply a first control signal to the first scanning lines to line sequentially scan the pixels in a unit of a row, a second scanner configured to successively supply a second control signal to the second scanning lines in synchronism with the line sequential scanning, and a signal selector configured to supply an image signal to the signal lines in synchronism with the line sequential scanning;

each of the pixels including a light emitting device, a sampling transistor, a drive transistor, a switching transistor, and a pixel capacitor;

the sampling transistor being connected at the gate thereof to one of the first scanning lines, at the source thereof to one of the signal lines and at the drain thereof to the gate of the drive transistor;

the drive transistor and the light emitting device being connected in series to form a current path between one of the power supply lines and one of the ground lines;

the switching transistor being inserted in the current path with the gate thereof connected to one of the second scanning lines;

the pixel capacitor being connected between the source and the gate of the drive transistor;

the driving method including the steps of:

placing the sampling transistor into an on state in response to the first control signal supplied from the first scanning line to sample the signal potential of the image signal supplied from the signal line and retain the sampled signal potential into the pixel capacitor;

placing the switching transistor into an on state in response to the second control signal supplied from the second scanning line to place the current path into a conducting state;

causing the drive transistor to supply driving current in response to the signal potential retained in the pixel capacitor to the light emitting device through the current path placed in the conducting state;

causing the first scanner to apply the first control signal to the first scanning line to turn on the sampling transistor to start sampling of the signal potential, whereafter the first scanner cancels the first control signal supplied to the first scanning line to turn off the sampling transistor; and causing the second scanner to apply, within an image signal writing period after the sampling transistor is turned on until the sampling transistor is turned off, the second control signal in the form of a pulse to the second scanning line so that the switching transistor exhibits an on state within predetermined correction time, apply first time correction for the mobility of the drive transistor to the signal potential retained in the pixel capacitor, and then apply, if the signal potential of the image signal is not high, second time correction for additional correction time at the last end of the image signal writing period to the signal potential retained in the pixel capacitor while prevent, if the signal potential of the image signal is high, application of the second time correction.

According to yet another embodiment of the present invention, there is provided an electronic apparatus including:

a display apparatus having;

a pixel array section; and a driving section configured to drive the pixel array section;

the pixel array section including a plurality of first and second scanning lines extending in the direction of a row, a plurality of signal lines extending in the direction of a column, a plurality of pixels disposed in a matrix at intersecting locations of the first and second scanning lines and the signal lines, and a plurality of power supply lines and ground lines configured to supply power to the pixels;

the driving section including a first scanner configured to successively supply a first control signal to the first scanning lines to line sequentially scan the pixels in a unit of a row, a second scanner configured to successively supply a second control signal to the second scanning lines in synchronism with the line sequential scanning, and a signal selector configured to supply an image signal to the signal lines in synchronism with the line sequential scanning, each of the pixels including a light emitting device, a sampling transistor, a drive transistor, a switching transistor, and a pixel capacitor, the sampling transistor being connected at the gate thereof to one of the first scanning lines, at the source thereof to one of the signal lines and at the drain thereof to the gate of the drive transistor, the drive transistor and the light emitting device being connected in series to form a current path between one of the power supply lines and one of the ground lines, the switching transistor being inserted in the current path with the gate thereof connected to one of the second scanning lines, the pixel capacitor being connected between the source and the gate of the drive transistor, the sampling transistor being placed into an on state in response to the first control signal supplied from the first scanning line to sample the signal potential of the image signal supplied from the signal line and retain the sampled signal potential into the pixel capacitor the switching transistor being placed into an on state in response to the second control signal supplied from the second scanning line to place the current path into a conducting state, the drive transistor supplying driving current in response to the signal potential retained in the pixel capacitor to the light emitting device through the current path placed in the conducting state, the first scanner applying the first control signal to the first scanning line to turn on the sampling transistor to start sampling of the signal potential, whereafter the first scanner cancels the first control signal supplied to the first scanning line to turn off the sampling transistor; and the second scanner being configured to apply, within an image signal writing period after the sampling transistor is turned on until the sampling transistor is turned off, the second control signal in the form of a pulse to the second scanning line so that the switching transistor exhibits an on state within predetermined correction time, apply first time correction for the mobility of the drive transistor to the signal potential retained in the pixel capacitor, and then apply, if the signal potential of the image signal is not high, second time correction for additional correction time at the last end of the image signal writing period to the signal potential retained in the pixel capacitor while prevent, if the signal potential of the image signal is high, application of the second time correction.

In the display apparatus, mobility correction operation is carried out separately twice. In the first time correction operation, within an image signal writing period after the sampling transistor is turned on until the sampling transistor is turned off, the switching transistor is placed into an on stage only for the predetermined correction time to apply the first time correction for the mobility of the drive transistor to the signal potential retained in the pixel capacitor. The predetermined correction time is defined by the pulse width of the control signal and can be controlled accurately. The first time correction time is optimized in conformity with a case wherein the image signal has a high level, that is, when the white is to be displayed. Thereafter, the second time mobility correction is carried out. This additional mobility correction is automatically controlled such that it is carried out when the signal potential of the image signal is not high, that is, in the case of gray display or the black display, but is not carried out when the signal potential of the image signal is high. Accordingly, when the signal potential is not high, the mobility correction is carried out twice, and the mobility correction time is optimized as the sum of the first time correction time and the second time correction time. On the other hand, where the signal potential is high, only the first time mobility correction is carried out, and the correction time therefor is optimized in accordance with the case wherein the signal potential is high. In this manner, mobility correction whose mobility correction time is optimized over all signal potentials from that for the black display to that for the white display can be carried out, and the uniformity of the display image can be improved over all signal potentials.

DETAILED DESCRIPTION OF THE PREFERRED EMBODIMENT

Figure 1:
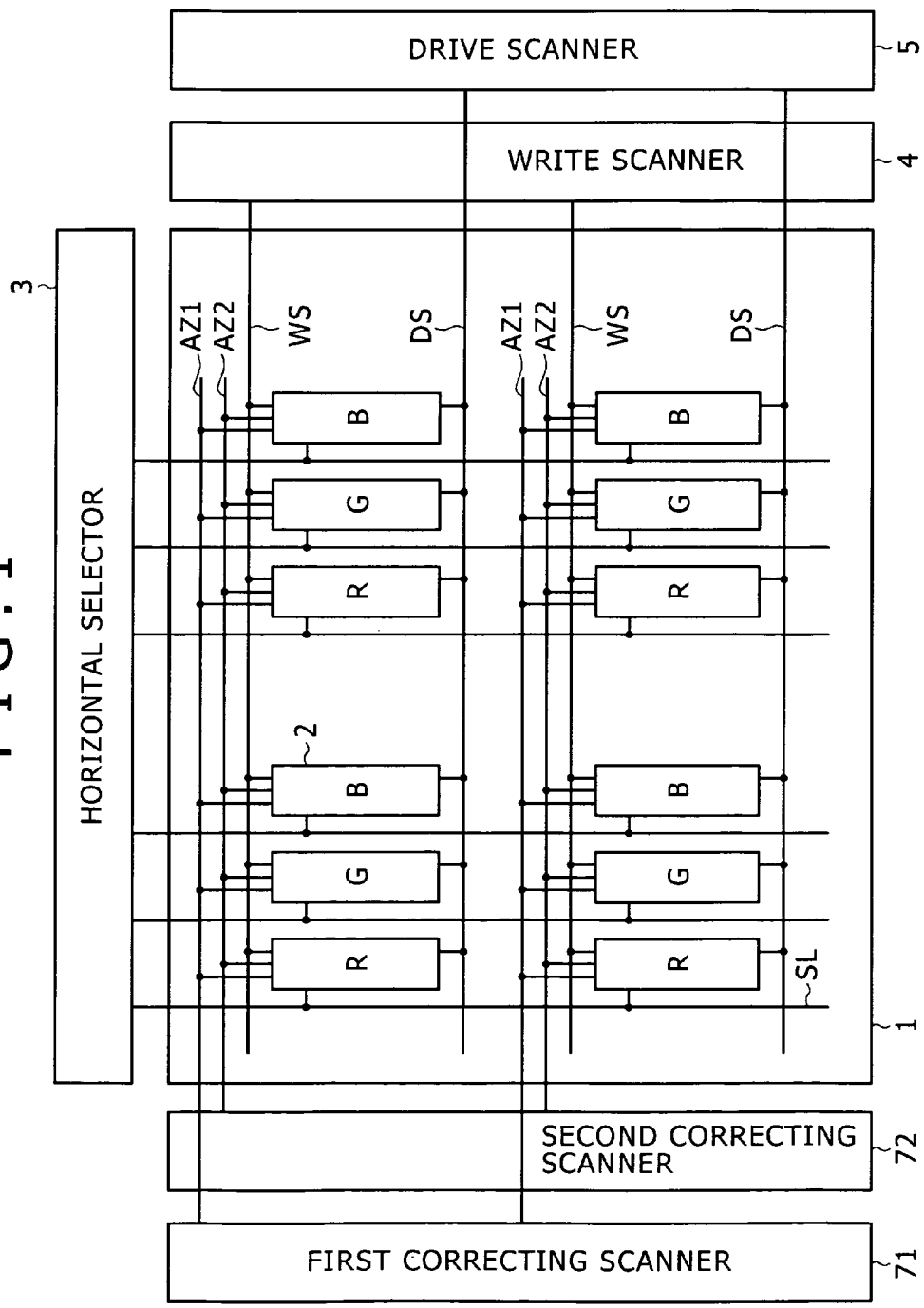
FIG. 1 is a block diagram showing a general configuration of a display apparatus to which an embodiment of the present invention is applied.

Referring first to FIG. 1, there is shown a general configuration of a display apparatus to which an embodiment of the present invention is applied. The display apparatus includes a pixel array section 1, a scanner section and a signal section as main components thereof. The scanner section and the signal section cooperatively form a driving section. The pixel array section 1 includes first scanning lines WS, second scanning lines DS, third scanning lines AZ1 and fourth scanning lines AZ2 all extending in a direction of a row, and signal lines SL extending in a direction of a column. The pixel array section 1 further includes pixel circuits 2 arranged in rows and columns and connected to the scanning lines WS, DS, AZ1 and AZ2 and the signal lines SL. The pixel array section 1 further includes a plurality of power supply lines for supplying a first potential Vss1, a second potential Vss2 and a third potential VDD necessary for operation of the pixel circuits 2. The signal section includes a horizontal selector 3 and supplies an image signal to the signal lines SL. The scanner section includes a write scanner 4, a drive scanner 5, a first correcting scanner 71 and a second correcting scanner 72 which supply control signals to the first scanning lines WS, second scanning lines DS, third scanning lines AZ1 and fourth scanning lines AZ2 to successively scan the pixel circuits 2 for individual rows.

Figure 2:
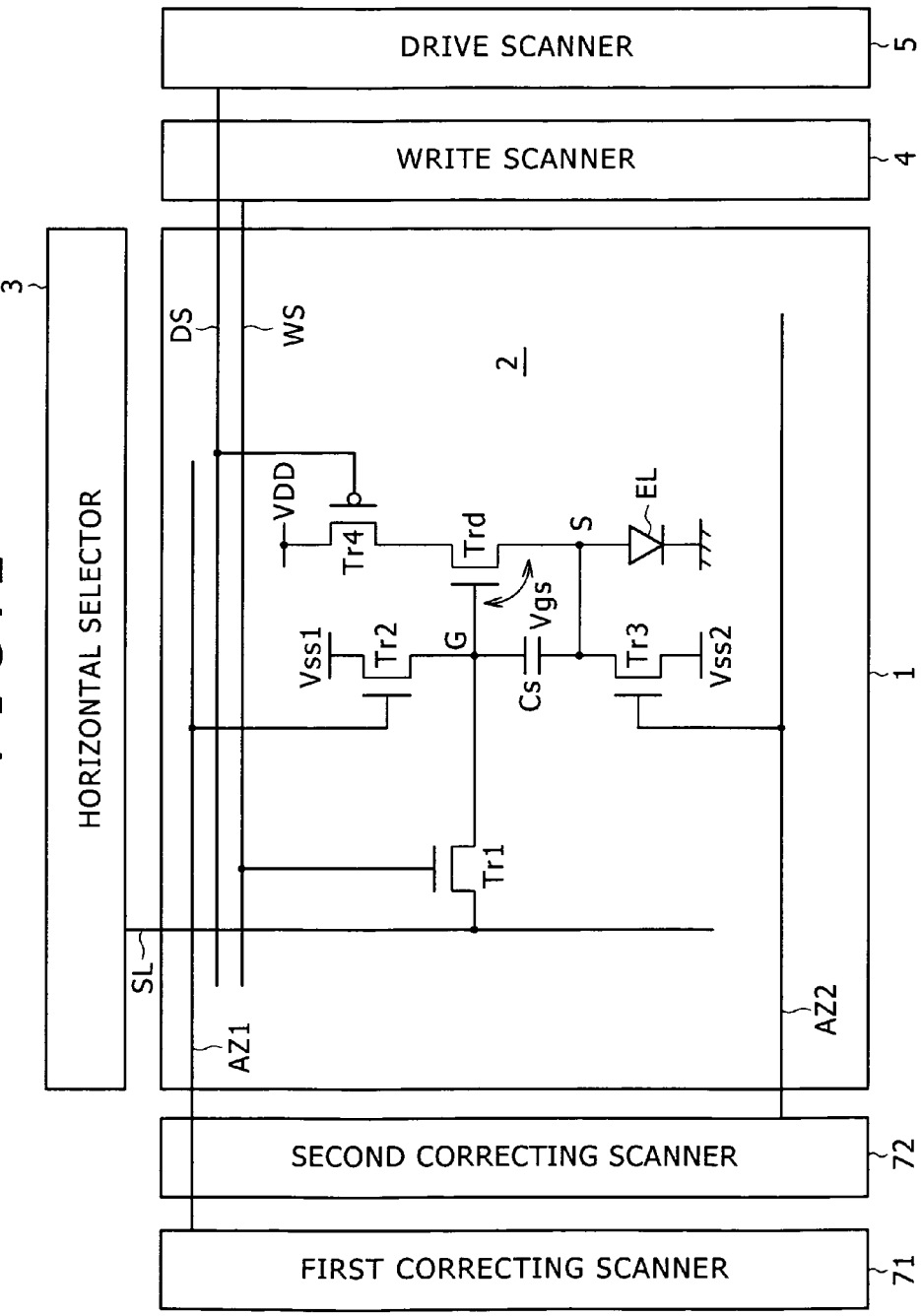
FIG. 2 is a block circuit diagram showing a configuration of a pixel circuit included in the display apparatus shown in FIG. 1.

Referring now to FIG. 2, there is shown a configuration of a pixel circuit incorporated in the image display apparatus shown in FIG. 1. The pixel circuit 2 shown includes a sampling transistor Tr1, a drive transistor Trd, a first switching transistor Tr2, a second switching transistor Tr3, a third switching transistor Tr4, a pixel capacitor Cs, and an light emitting device EL. The sampling transistor Tr1 conducts in response to a control signal supplied thereto from a scanning line WS within a predetermined sampling period to sample a signal potential of an image signal supplied from a signal line SL into the pixel capacitor Cs. The pixel capacitor Cs applies an input voltage Vgs to the gate G of the drive transistor Trd in response to the signal potential of the image signal sampled therein. The drive transistor Trd supplies output current Ids according to the input voltage Vgs to the light emitting device EL. The light emitting device EL emits light with luminance according to the signal potential of the image signal from the output current Ids supplied thereto from the drive transistor Trd within a predetermined light emission period.

The first switching transistor Tr2 conducts in response to a control signal supplied thereto from a scanning line AZ1 prior to the sampling period which is an image signal writing period to set the gate G of the drive transistor Trd to the first potential Vss1. The second switching transistor Tr3 conducts in response to a control signal supplied thereto from a scanning line AZ2 prior to the sampling period to set the source S of the drive transistor Trd to the second potential Vss2. The third switching transistor Tr4 conducts in response to a control signal supplied thereto from a scanning line DS prior to the sampling period to connect the drive transistor Trd to the third potential VDD so that a voltage corresponding to a threshold voltage Vth of the drive transistor Trd is retained into the pixel capacitor Cs to compensate for the influence of the threshold voltage Vth. Further, the third switching transistor Tr4 conducts in response to a control signal supplied thereto from the scanning line DS within a light emitting period to connect the drive transistor Trd to the third potential VDD so that output current Ids flows to the light emitting device EL.

As can be recognized from the foregoing description, the present pixel circuit 2 is formed from five transistors Tr1 to Tr4 and Trd, one pixel capacitor Cs and one light emitting device EL. The transistors Tr1 to Tr3 and Trd are N-channel polycrystalline silicon TFTs. Only the third switching transistor Tr4 is a P-channel polycrystalline silicon TFT. However, according to the embodiment of the present invention, the configuration of the pixel circuit is not limited to this but may include a suitable combinations of N-channel TFTs and P-channel TFTs. The light emitting device EL is, for example, an organic EL device of the diode type which includes an anode and a cathode. However, according to the embodiment of the present invention, the light emitting device EL is not limited to this, but may be any device which generally is driven by current to emit light.

Figure 3:
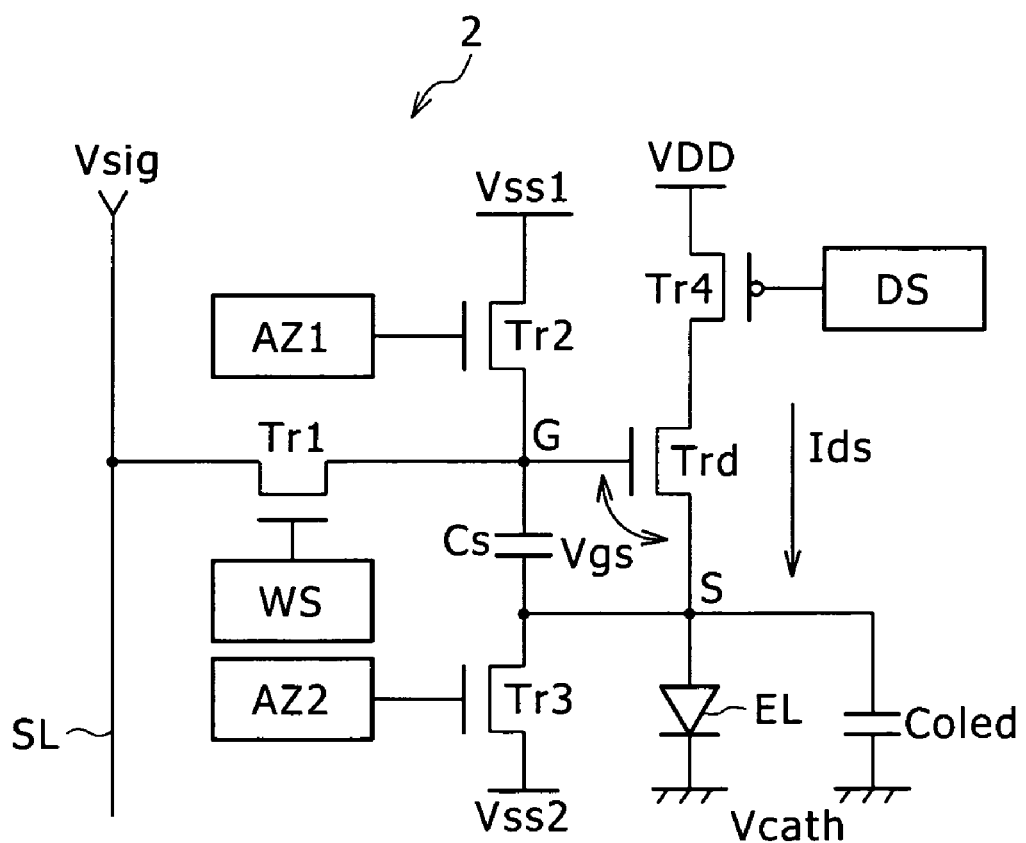
FIG. 3 is a circuit diagram showing the pixel circuit shown in FIG. 2.

FIG. 3 shows only a pixel circuit 2 extracted from the image display apparatus shown in FIG. 2. In order to facilitate understandings, a signal potential Vsig of an image signal sampled by the sampling transistor Tr1, an input voltage Vgs and output current Ids of the drive transistor Trd, a capacitance component Coled which the light emitting device EL has, and so forth are additionally illustrated in FIG. 3. In the following, operation of the pixel circuit 2 is described with reference to FIG. 3.

Figure 4:
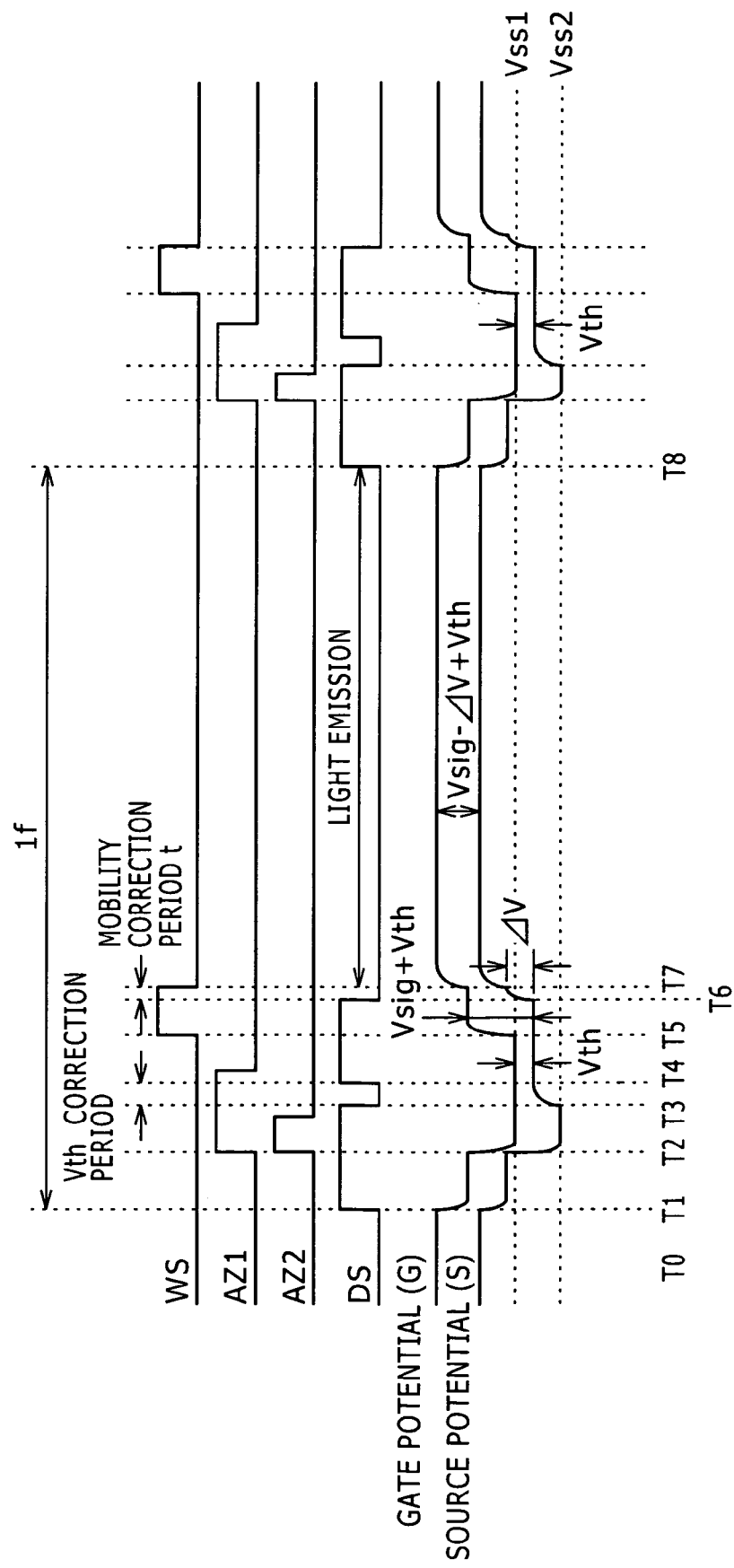
FIG. 4 is a timing chart illustrating operation of the display apparatus shown in FIGS. 1 and 2.

FIG. 4 is a timing chart illustrating operation of the pixel circuit 2 shown in FIG. 3. The timing chart illustrates a driving method which has been developed already and based on which the embodiment of the present invention has been made. In order to clarify the background of the present invention and facilitate understanding of the present invention, the formerly developed driving method is described particularly with reference to the timing chart of FIG. 4. FIG. 4 illustrates waveforms of control signals applied to the scanning lines WS, AZ1, AZ2 and DS along a time axis T. For simplified illustration, also the control signals are denoted by like reference characters to those of the corresponding scanning lines. Since the transistors Tr1, Tr2 and Tr3 are of the N-channel type, they exhibit an on state when the scanning lines WS, AZ1 and AZ2 have the high level, but exhibit an off state when the scanning lines WS, AZ1 and AZ2 have the low level. On the other hand, since the third switching transistor Tr4 is of the P-channel type, it exhibits an off state when the scanning line DS has the high level, but exhibits an on state when the scanning line DS has the low level. It is to be noted that the timing chart of FIG. 4 illustrates, in addition to the waveforms of the control signals WS, AZ1, AZ2 and DS, the potential variation at the gate G of the drive transistor Trd and the potential variation at the source S of the drive transistor Trd.

In the timing chart of FIG. 4, timings T1 to T8 define one field (1f). The rows of the pixel array are successively scanned once within a period of one field. The timing chart illustrates the waveforms of the control signals WS, AZ1, AZ2 and DS applied to the pixels for one row.

At a timing T0 before one field starts, all of the control signals WS, AZ1, AZ2 and DS have the low level. Accordingly, while the N-channel transistors Tr1, Tr2 and Tr3 are in an off state, only the P-channel third switching transistor Tr4 is in an on state. Accordingly, since the drive transistor Trd is connected to the power supply VDD through the transistor Tr4 in an on state, it supplies output current Ids to the light emitting device EL in response to the predetermined input voltage Vgs. Accordingly, at the timing T0, the light emitting device EL is in a light emitting state. At this time, the input voltage Vgs applied to the drive transistor Trd is represented by the difference between the gate potential (G) and the source potential (S).

At the timing T1 at which the field starts, the control signal DS changes over from the low level to the high level. Consequently, the switching transistor Tr4 is turned off to disconnect the drive transistor Trd from the power supply VDD. As a result, the emission of light stops and a no-light emitting period is entered. Accordingly, at the timing T1, all transistors Tr1 to Tr4 enter an off state.

Then at the timing T2, the control signals AZ1 and AZ2 change over to the high level, and consequently, the switching transistors Tr2 and Tr3 are placed into an on state. As a result, the gate G of the drive transistor Trd is connected to the reference potential Vss1 and the source S of the drive transistor Trd is connected to the reference potential Vss2. Here, Vss1−Vss2>Vth is satisfied, and the reference potentials Vss1 and Vss2, input voltage Vgs and threshold voltage Vth are set so as to satisfy Vss1−Vss2=Vgs>Vth to carry out preparations for the Vth correction which is carried out at the later timing T3. In other words, the period between the timings T2 and T3 corresponds to a reset period for the drive transistor Trd. Meanwhile, if the threshold value of the light emitting device EL is represented by VthEL, then the second potential Vss2 and the threshold value VthEL are set so as to satisfy VthEL>Vss2. Consequently, a negative bias is applied to the light emitting device EL and a reversely biased state is established. This reversely biased state is necessary to regularly carry out Vth correction operation and mobility correction operation, which are to be carried out later.

At the timing T3, the control signal AZ2 is set to the low level, and immediately after this, also the control signal DS is set to the low level. Consequently, the transistor Tr3 is turned off while the transistor Tr4 is turned on. As a result, drain current Ids flows into the pixel capacitor Cs to start Vth correction operation. At this time, the gate G of the drive transistor Trd is held at the potential Vss1, and the current Ids continues to flow until after the drive transistor Trd cuts off. If the drive transistor Trd cuts off, then the source potential (S) of the drive transistor Trd becomes equal to Vss1−Vth. At the timing T4 after the drain current cuts off, the control signal DS is returned to the high level to turn off the switching transistor Tr4. Also the control signal AZ1 is returned to the low level to turn off the switching transistor Tr2 as well. As a result, the threshold voltage Vth is held and fixed in the pixel capacitor Cs. In this manner, within the period between the timings T3 and T4, the threshold voltage Vth of the drive transistor Trd is detected. Here, the detection period T3-T4 is referred to as Vth correction period.

At the timing T5 after the Vth correction is carried out in this manner, the control signal WS is changed over to the high level and the sampling transistor Tr1 is turned on to write the image signal Vsig into the pixel capacitor Cs. The pixel capacitor Cs is sufficiently lower than the equivalent capacitance Coled of the light emitting device EL. As a result, most of the image signal Vsig is written into the pixel capacitor Cs. Accurately, the difference Vsig−Vss1 of the image signal Vsig from the potential Vss1 is written into the pixel capacitor Cs. Accordingly, the voltage Vgs between the gate G and the source S of the drive transistor Trd becomes equal to a level Vsig−Vss1+Vth which is the sum of the threshold voltage Vth detected and retained formerly and the voltage difference Vsig−Vss1 sampled in the present operation cycle. If it is assumed that the first potential Vss1 is Vss1=0 V in order to simplify later description, then the gate/source voltage Vgs is given by Vsig+Vth as seen from the timing chart of FIG. 4. Such sampling of the image signal Vsig is carried out till the timing T7 at which the control signal WS changes over back to the low level. In other words, the period between the timings T5 and T7 corresponds to a sampling period or image signal writing period.

At the timing T6 before the timing T7 at which the sampling period ends, the control signal DS is placed into the low level to turn on the switching transistor Tr4. Since this connects the drive transistor Trd to the power supply VDD, the pixel circuit advances from the no-light emitting period to a light emitting period. Within the period T6-T7 within which the sampling transistor Tr1 still remains in an on state and the switching transistor Tr4 is in an on state in this manner, mobility correction of the drive transistor Trd is carried out. In particular, in the formerly developed driving method, the mobility correction is carried out within the period T6-T7 within which a rear portion of a sampling period and a top portion of a light emitting period overlap with each other. It is to be noted that, at the top of the light emitting period within which the mobility correction is carried out, the light emitting device EL does not actually emit light because it is in a reversely biased state. Within the mobility correction period T6-T7, the drain current Ids flows through the drive transistor Trd while the gate G of the drive transistor Trd is fixed to the level of the image signal Vsig. Here, since the light emitting device EL is placed in a reversely biased state if the first potential Vss1 is set so as to satisfy Vss1−Vth<VthEL, the light emitting device EL exhibits not a diode characteristic but a simple capacitor characteristic. Therefore, the current Ids flowing to the drive transistor Trd is written into a capacitor C=Cs+Coled which is the sum of the pixel capacitor Cs and the equivalent capacitance Coled of the light emitting device EL. Consequently, the source potential (S) of the drive transistor Trd gradually rises. In the timing chart of FIG. 4, the rise amount of the source potential (S) is represented by ΔV. Since this rise amount ΔV is after all subtracted from the gate/source voltage Vgs held in the pixel capacitor Cs, this is equivalent to application of negative feedback. The mobility μ can be corrected by negatively feeding back the output current Ids of the drive transistor Trd to the input voltage Vgs of the drive transistor Trd in this manner. It is to be noted that the negative feedback amount ΔV can be optimized by adjusting the time width t of the mobility correction period T6-T7.

At the timing T7, the control signal WS changes over to the low level to turn off the sampling transistor Tr1. As a result, the gate G of the drive transistor Trd is disconnected from the signal line SL. Since the application of the image signal Vsig is canceled, the gate voltage (G) of the drive transistor Trd is enabled to rise and thus rises together with the source potential (S). Meanwhile, the gate/source voltage Vgs retained in the pixel capacitor Cs maintains its value of Vsig−ΔV+Vth. As the source potential (S) rises, the reversely biased state of the light emitting device EL is canceled soon, and consequently, the light emitting device EL actually starts emission of light as the output current Ids flows into the light emitting device EL. The relationship between the drain current Ids and the gate voltage Vgs in this instance is given by the following expression (2) by substituting Vsig−ΔV+Vth into the transistor characteristic expression (1) given hereinabove:

$$Ids = k\mu(Vgs-Vth)^2 = k\mu(Vsig-\Delta V)^2 \quad (2)$$

where k=(½)(W/L)Cox. From the characteristic expression (2), it can be recognized that the term of Vth is canceled and the output current Ids supplied to the light emitting device EL does not rely upon the threshold voltage Vth of the drive transistor Trd. Basically the drain current Ids depends upon the signal potential Vsig of the image signal. In other words, the light emitting device EL emits light with luminance according to the signal potential Vsig. Thereupon, the signal potential Vsig has a value corrected with the negative feedback amount ΔV. The correction amount ΔV acts to cancel the effect of the mobility μ positioned just at the coefficient part of the characteristic expression (2). Accordingly, the drain current Ids substantially relies only upon the image signal Vsig.

Finally at the timing T8, the control signal DS changes over to the high level to turn off the third switching transistor Tr4. Consequently, the emission of light ends and the field ends. Therefore, a next field is started, and the Vth correction operation, mobility correction operation and light emission operation are repeated for the next field.

Figure 5:
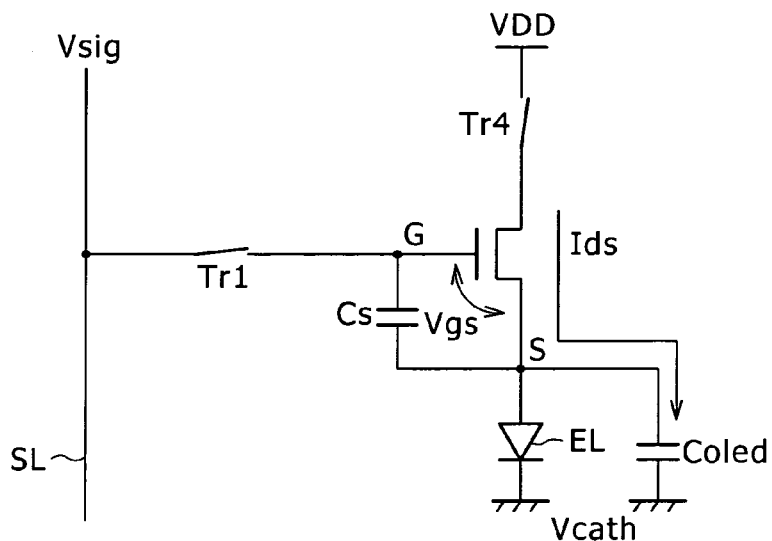
FIG. 5 is a circuit diagram illustrating operation of the pixel circuit shown in FIG. 3.

FIG. 5 illustrates a state of the pixel circuit 2 within the mobility correction period T6-T7. As seen in FIG. 5, within the mobility correction period T6-T7, the sampling transistor Tr1 and the third switching transistor Tr4 are in an on state while the other switching transistors Tr2 and Tr3 are in an off state. In this state, the source potential (S) of the drive transistor Tr4 is Vss1−Vth. This source potential (S) is also the anode potential of the light emitting device EL. As described hereinabove, where the first potential Vss1 is set so as to satisfy Vss1−Vth<VthEL, the light emitting device EL is placed in a reversely biased state and consequently exhibits not a diode characteristic but a simple capacitor characteristic. Therefore, the current Ids flowing through the drive transistor Trd flows into the composite capacitor C=Cs+Coled of the pixel capacitor Cs and the equivalent capacitor Coled of the light emitting device EL. In other words, part of the drain current Ids is negatively fed back to the pixel capacitor Cs to carry out correction of the mobility.

Figure 6:
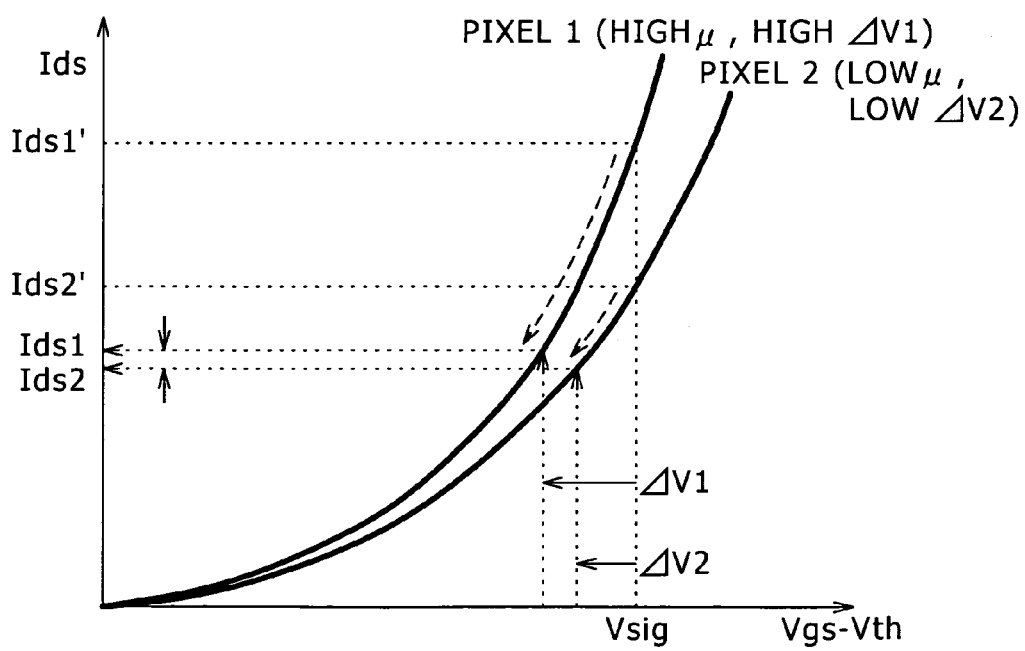
FIGS. 6 and 7 are graphs illustrating operation of the pixel circuit shown in FIG. 3.

FIG. 6 is a graph of the transistor characteristic expression (2) given hereinabove, and wherein the axis of ordinate indicates the output current Ids and the axis of abscissa indicates the image signal Vsig. Also the characteristic expression (2) is indicated below the graph. In the graph of FIG. 6, characteristic curves are drawn for comparison between the characteristics of a pixel 1 and another pixel 2. The mobility μ of the drive transistor of the pixel 1 is relatively high. On the contrary, the mobility μ of the drive transistor included in the pixel 2 is relatively low. Where the drive transistor is formed from a polysilicon thin film transistor or the like in this manner, it cannot be avoided that the mobility μ disperses between the pixels. For example, if signal potentials Vsig of an image signal having the same level are written into the two pixels 1 and 2, if no correction of the mobility is carried out, then the output current Ids1' flowing to the pixel 1 having the high mobility μ exhibits a great difference from the output current Ids2' flowing through the pixel 2 having the low mobility μ. Since a great difference in the output current Ids is caused by a dispersion in mobility μ in this manner, stripe unevenness appears with a display image and damages the uniformity of the display image.

Therefore, in the formerly developed driving method described above, output current is negatively fed back to the input voltage side to cancel the dispersion in mobility. As can be recognized apparently from the transistor characteristic expression (1) given hereinabove, as the mobility increases, the drain current Ids increases. Accordingly, as the mobility increases, the negative feedback amount ΔV increases. As seen from the graph of FIG. 6, the negative feedback amount ΔV1 of the pixel 1 having a high mobility μ is higher than the negative feedback amount ΔV2 of the pixel 2 having a low mobility. Accordingly, as the mobility μ increases, a greater amount of negative feedback is applied, and therefore, the dispersion can be suppressed. As seen from FIG. 6, if correction of the negative feedback amount ΔV1 is applied to the pixel 1 having a high mobility μ, then the output current drops by a great amount from Ids1' to Ids1. On the other hand, since the correction amount ΔV2 of the pixel 2 having a low mobility μ is small, the output current Ids2' does not drop by a great amount to Ids2. As a result, the output current Ids1 and the output current Ids2 become substantially equal to each other, and the dispersion in mobility between them is canceled. Since the cancellation of the dispersion in mobility is carried out over the overall range of the signal potential Vsig from the black level to the white level, the uniformity of the screen image becomes very high. In summary, where pixels 1 and 2 having different mobility values are involved, the correction amount ΔV1 of the pixel 1 having a high mobility is smaller than the correction amount ΔV2 of the pixel 2 having a low mobility. In other words, as the mobility increases, the correction amount ΔV increases and the reduction value of the output current Ids increases. Consequently, the current values of pixels having different mobility values are uniformized, and the dispersion in mobility can be corrected.

For reference, a numerical analysis of the mobility correction described above is performed. In the analysis, the source potential of the drive transistor Trd is taken as a variable in a state wherein the transistors Tr1 and Tr4 are on as seen in FIG. 5. Where the source potential (S) of the drive transistor Trd is represented by V, the drain current Ids flowing through the drive transistor Trd is given by the following expression (3):

$$I_{ds}=k\mu(V_{gs}-V_{th})^2=k\mu(V_{sig}-V-V_{th})^2 \quad (3)$$

Further, from the relationship between the drain current Ids and the capacitor C (=Qs+Coled), the relationship of Ids=dQ/dt=CdV/dt is satisfied as given by the following expression (4):

$$I_{ds} = \frac{dQ}{dt} = C\frac{dV}{dt} \quad (4)$$

$$\int \frac{1}{C} dt =$$

$$\int \frac{1}{I_{ds}} dV \Leftrightarrow \int_0^t \frac{1}{C} dt = \int_{-V_{th}}^V \frac{1}{k\mu(V_{sig}-V_{th}-V)^2} dV \Leftrightarrow \frac{k\mu}{C}t =$$

$$\left[\frac{1}{V_{sig}-V_{th}-V}\right]_{-V_{th}}^V = \frac{1}{V_{sig}-V_{th}-V} - \frac{1}{V_{sig}} \Leftrightarrow V_{sig}-V_{th}-V =$$

$$\frac{1}{\frac{1}{V_{sig}} + \frac{k\mu}{C}t} = \frac{V_{sig}}{1+V_{sig}\frac{k\mu}{C}t}$$

The expression (3) is substituted into the expression (4), and the opposite sides of a result of the substitution are integrated. Here, it is assumed that the initial state of the source potential V is −Vth, and the mobility dispersion correction time (T6-T7) is represented by t. If this differential expression is solved, then the pixel current for the correction time t is given by the following expression (5):

$$I_{ds}=k\mu(V_{gs}-V_{th})^2=k\mu(V_{sig}-V-V_{th})^2 \quad (5)$$

Figure 7:
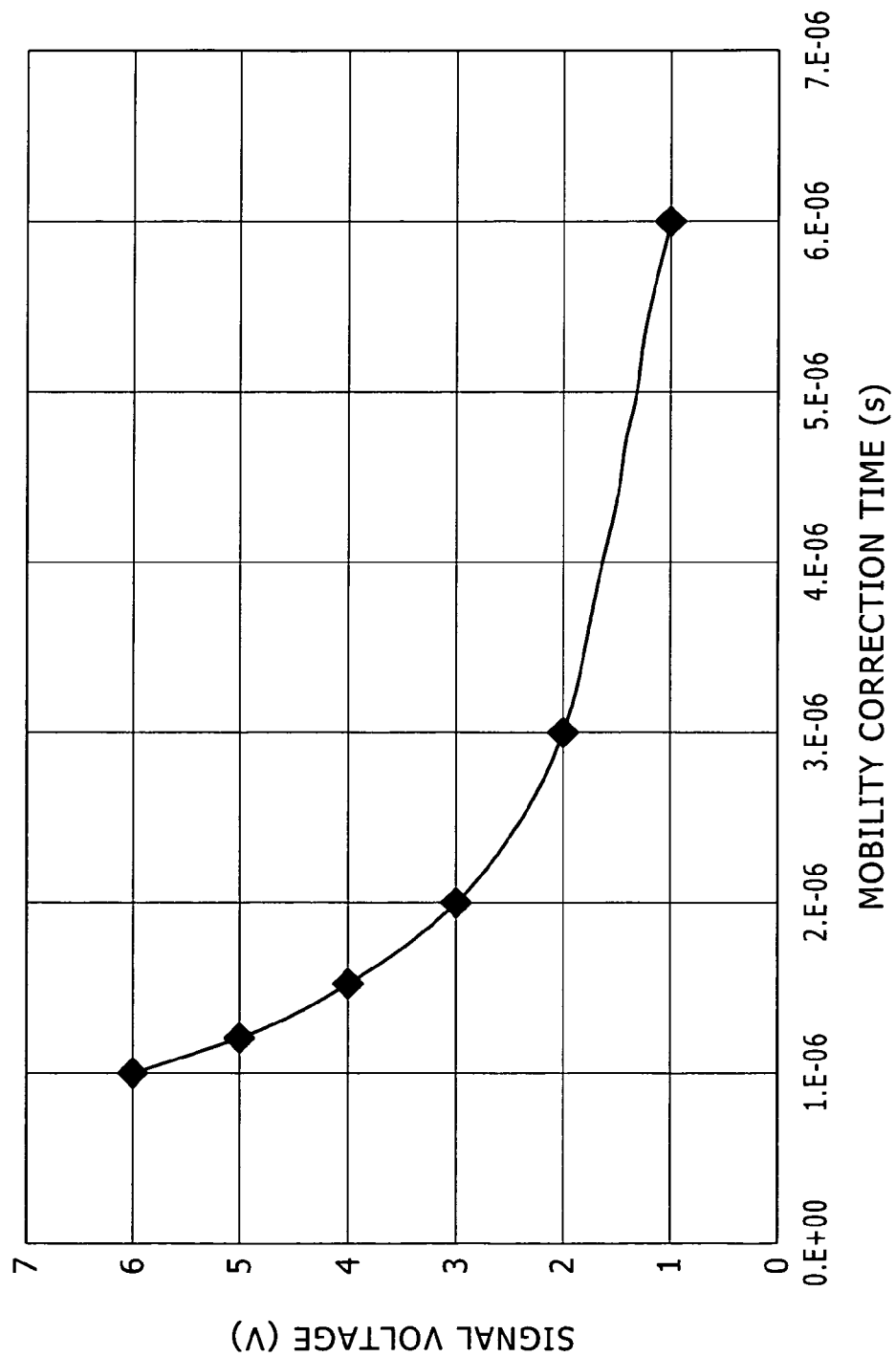

Incidentally, the optimum mobility correction time is not necessarily fixed but varies in response to the signal voltage. FIG. 7 illustrates a relationship between the optimum mobility correction time and the signal voltage. As can be seen from FIG. 7, when the signal voltage is high at the white level, the optimum mobility correction time is comparatively short. When the signal voltage is at a gray level, the optimum mobility correction time is longer, and further at the black level, the optimum mobility correction time is inclined to further increase. As described hereinabove, the correction amount ΔV to be negatively fed back to the pixel capacitance during a period of mobility correction increases in proportion to the signal potential Vsig. Since, as the signal voltage increases, the negative feedback amount increases as much, the optimum mobility correction time is inclined to decrease. On the contrary, as the signal voltage drops, the current supplying capacity of the drive transistor drops, and consequently, the optimum mobility correction time necessary for sufficient correction is inclined to increase.

Therefore, in the formerly developed driving method described above, the turning off timing of the sampling transistor Tr1 is automatically adjusted so that, when the signal potential Vsig of the image signal supplied to the signal line SL is high, the correction time t is short whereas the correction time t is long when the signal potential Vsig of the image signal supplied to the signal line SL is low. This principle is illustrated in a waveform diagram of FIG. 8.

Figure 8:
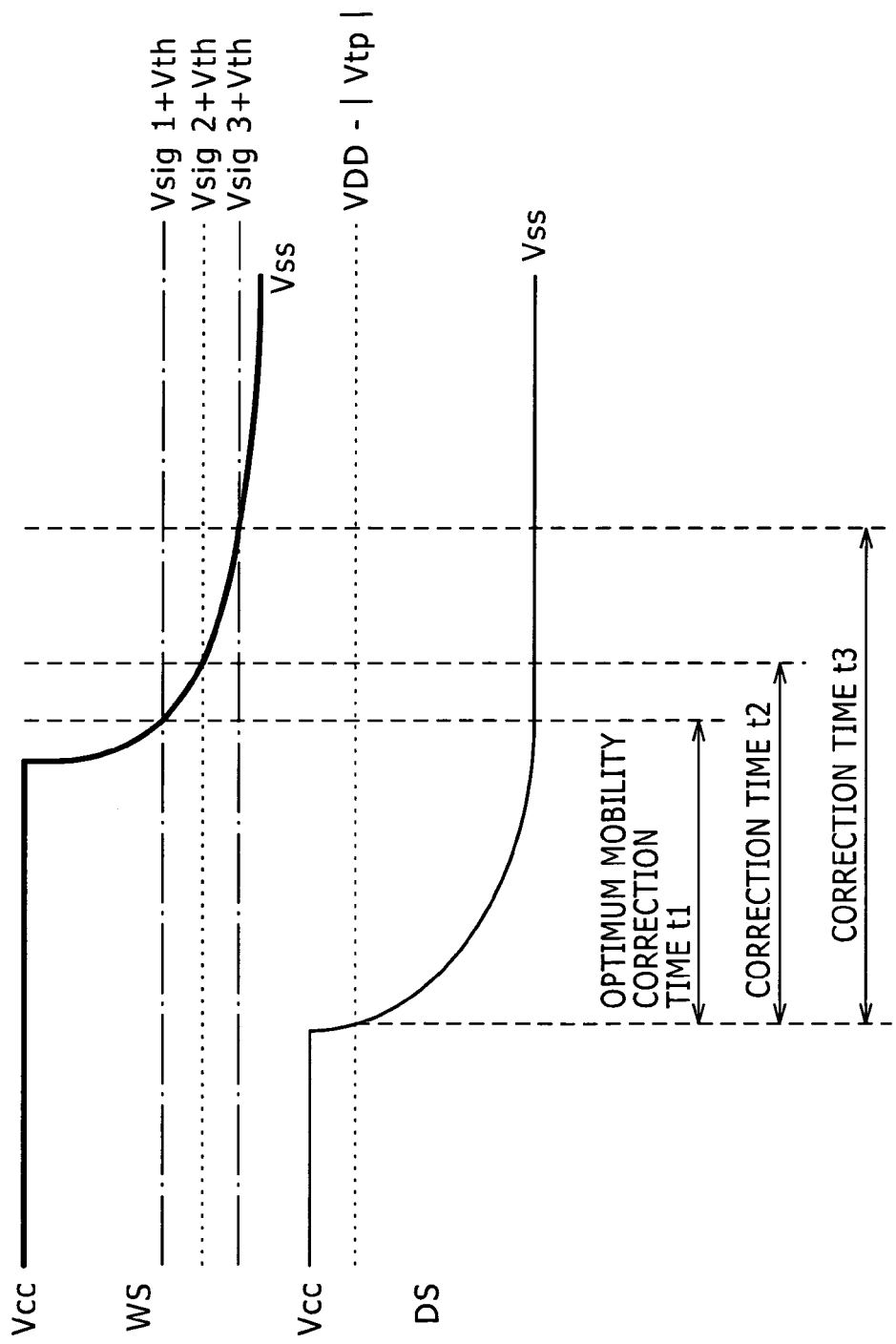
FIG. 8 is a waveform diagram illustrating operation of the pixel circuit shown in FIG. 3.

Referring to FIG. 8, the waveform diagram illustrates a falling edge waveform of the control signal DS and a falling edge waveform of the control signal WS which define an on timing of the switching transistor Tr4 and an off timing of the sampling transistor Tr1 which define the mobility correction time t. As described hereinabove, the switching transistor Tr4 is turned on to start mobility correction time at a point of time at which the control signal DS applied to the gate of the switching transistor Tr4 becomes lower than VDD−|Vtp|.

Meanwhile, the control signal WS is applied to the gate of the sampling transistor Tr1. The falling edge waveform of the control signal WS varies such that the level thereof drops steeply from the power supply potential Vcc first and thereafter drops moderately toward the ground potential Vss. Here, when the signal potential Vsig1 applied to the source of the sampling transistor Tr1 is high at the white level, the gate potential of the sampling transistor Tr1 drops quickly to Vsig1+Vtn, and therefore, the optimum mobility correction time t1 becomes short. If the signal potential becomes a gray level Vsig2, then at a point of time when the gate potential drops from Vcc to Vsig2+Vtn, the sampling transistor Tr1 is turned off. As a result, the optimum mobility correction time t2 corresponding to the signal potential Vsig2 of the gray level becomes longer from the optimum mobility correction time t1. Further, when the signal potential becomes a signal potential Vsig3 near to the black level, then the optimum mobility correction time t3 further becomes longer than the optimum mobility correction time t2 at the gray level.

Figure 9:
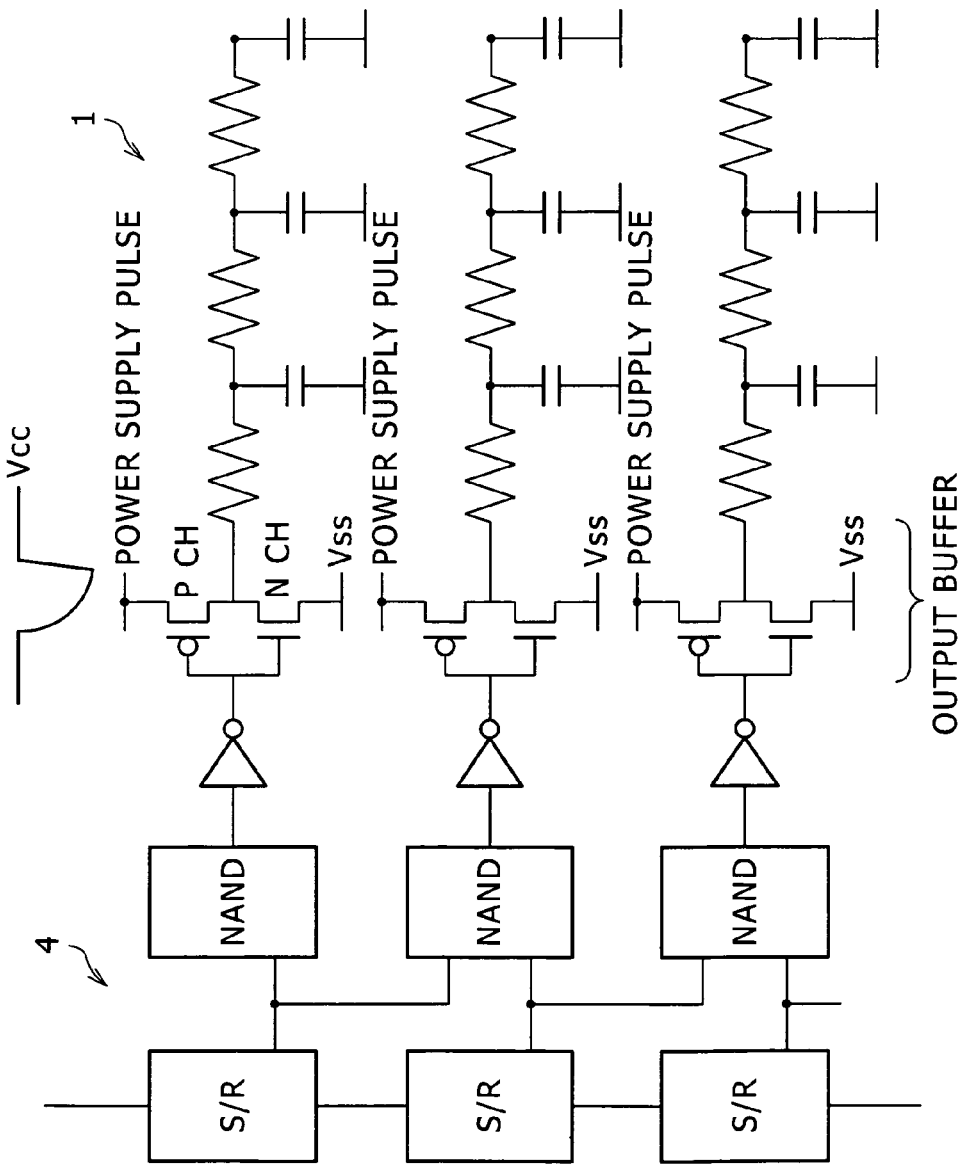
FIG. 9 is a circuit diagram showing a configuration of a write scanner included in the display apparatus shown in FIG. 1.

In order to automatically set the optimum mobility correction time for each gradation, it is necessary to shape the waveform of the falling edge of a control signal pulse to be applied to the scanning line WS to an optimum shape. Therefore, the formerly developed driving method adopts a write scanner of the type which samples power supply pulses. Thus, the write scanner is described with reference to FIG. 9. FIG. 9 shows the write scanner 4 for three output sections and the pixel array section 1 for three rows or three lines connected to the output sections of the write scanner 4.

The write scanner 4 includes a shift register S/R and operates in response to a clock signal inputted thereto from the outside to successively transfer a start signal inputted thereto from the outside similarly thereby to successively output a signal for the individual stages. A NAND device is connected to each stage of the shift register S/R and logically NANDs the signals successively outputted from adjacent ones of the shift stages of the shift register S/R to produce a rectangular waveform from which the control signal WS is to be formed. The rectangular waveform is inputted to an output buffer through an inverter. The output buffer operates in response to an input signal supplied from the shift register side to supply a final control signal WS to a scanning line WS of the pixel array section 1.

The output buffer is formed from a pair of switching devices connected in series between the power supply potential Vcc and the ground potential Vss. In the embodiment of the present embodiment, the output buffer has an inverter configuration, and one of the switching devices is a P-channel transistor Pch typically in the form of a PMOS transistor while the other switching device is an N-channel transistor Nch typically in the form of an NMOS transistor. It is to be noted that each line connected to each output buffer on the pixel array section 1 side is represented by a resistance component and a capacitance component in a manner of an equivalent circuit.

The present embodiment is configured such that an output buffer samples a power supply pulse to be supplied to a power supply line and produces a determination waveform of a control signal. As described hereinabove, the output buffer has an inverter configuration wherein a P-channel transistor Pch and an N-channel transistor Nch are connected in series between the power supply line and the ground potential Vss. When the P-channel transistor Pch of the output buffer is turned on in response to an input signal from the shift register S/R side, a falling edge waveform of the power supply pulse supplied to the power supply line is sampled. Then, the sampled waveform is supplied as a determination waveform of the control signal WS to the pixel array section 1 side. By producing a pulse including a determination waveform separately from the output buffer and supplying the pulse to the power supply line of the output buffer, the control signal WS of a desired determination waveform can be produced. In this instance, the output buffer samples a falling edge waveform of a power supply pulse supplied from the outside when the P-channel transistor Pch on the superior switching device side is turned on and the N-channel transistor Nch on the inferior switching device side is turned off, and outputs the sampled waveform as a determination waveform of the control signal WS.

Figure 10:
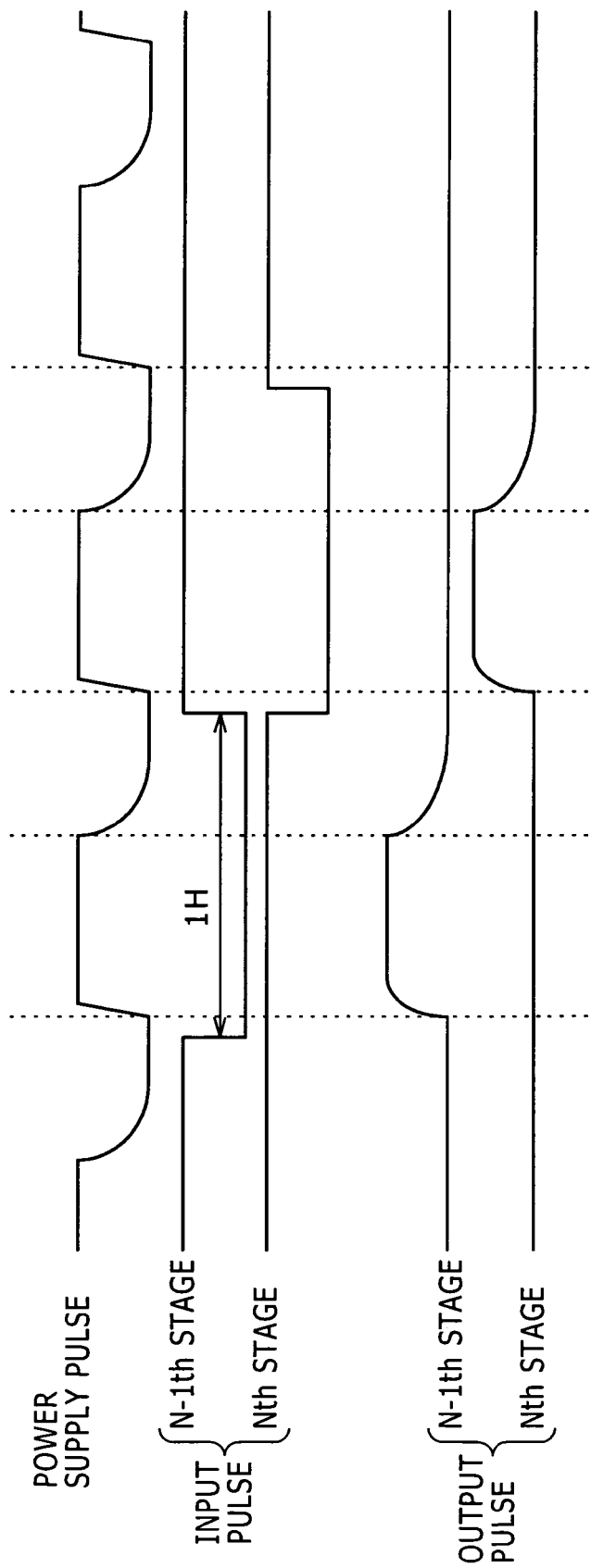
FIGS. 10 and 11 are waveform diagrams illustrating operation of the write scanner shown in FIG. 9.

FIG. 10 illustrates operation of the write scanner shown in FIG. 9. Referring to FIG. 10, a string of power supply pulses which vary in a period of 1H is inputted to the power supply line of the output buffer of the write scanner from the outside. Together with this, an input pulse is applied to the inverter of the output buffer. The timing chart of FIG. 9 illustrates input pulses to be supplied to the inverters on the N−1th and Nth stages. Output pulses supplied from the N−1th and Nth stages of the shift register S/R are illustrated together with the input pulses in the same time sequence. The output pulses are control signals applied to the corresponding scanning lines WS.

As can be seen apparently from the timing chart of FIG. 10, the output buffer at each stage of the write scanner samples a power supply pulse in response to an input pulse and supplies the sampled power supply pulse as it is as an output pulse to a corresponding scanning line WS. The power supply pulse is supplied from the outside, and the falling edge waveform of the power supply pulse can be set optimally in advance. The write scanner samples the falling edge waveform as it is and uses the sampled waveform as it is as a control signal pulse.

Figure 11:
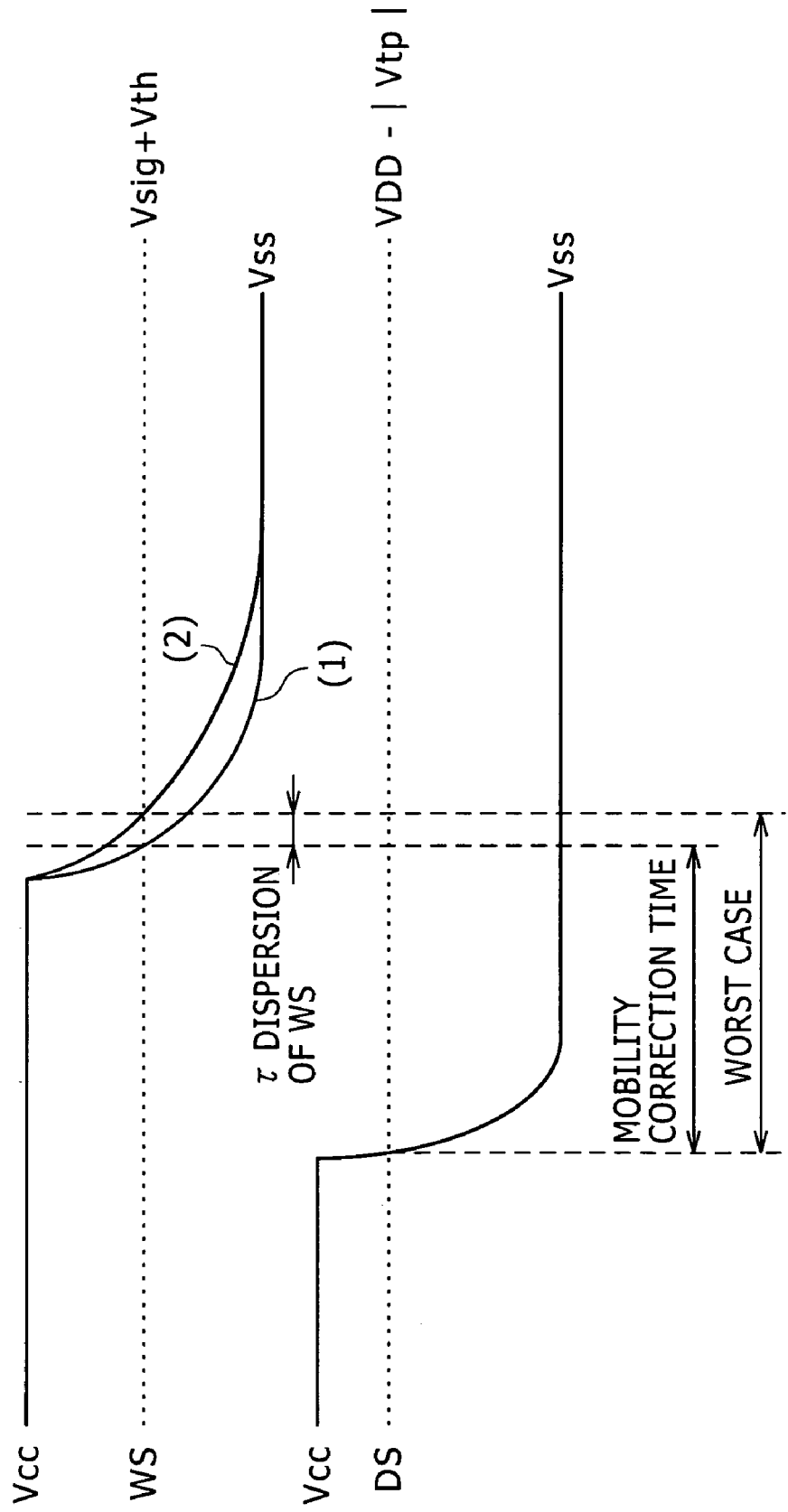

FIG. 11 illustrates a falling edge waveform of a control signal WS outputted from the write scanner shown in FIG. 9. Also a falling edge waveform of the control signal DS outputted from the drive scanner 5 is illustrated on the common time axis.

The write scanner shown in FIG. 9 adopts a power supply pulse sampling method and can basically sample a falling edge waveform of a power supply pulse as it is to form a falling edge of the scanning line WS. Actually, however, the falling edge waveform of the control signal WS is deformed by an influence of the operation characteristic of the transistor of the inverter which composes the output buffer. The waveform diagram of the control signal WS of FIG. 11 represents a reference phase by a curve (1) and represents a waveform which suffers particularly much from distortion by a distortion worst phase (2).

When the input to the output buffer changes over to the low level as seen in FIG. 9, the P-channel transistor of the inverter which forms the output buffer is rendered conducting to sample a power supply pulse. As the level of the power supply pulse sampled here decreases, the voltage Vgs applied between the gate and the source of the P-channel transistor during operation of the P-channel transistor decreases. As the voltage Vgs decreases during the operation, the transient of the sampled power supply pulse becomes more likely to be influenced by the characteristic dispersion of the P-channel transistor, resulting in appearance of dispersion in the correction time. In the example illustrated, when the scanning line WS has the dispersion worst phase (2), the timing at which the sampling transistor Tr1 is turned on in response to a falling edge of the control signal WS is shifted rearwardly when compared with that when the scanning line WS has the standard phase (1). Therefore, the mobility correction time increased as much. Since the optimum correction time is short particularly at the white gradation, the dispersion appears conspicuously and causes stripe unevenness if this is not eliminated.

In order to cope with the problem described above of the formerly developed driving method, according to the embodiment of the present invention, mobility correction is carried out twice separately so as to suppress the dispersion of the mobility correction time. In the first time mobility correction, mobility correction time is determined only based on a pulse of the control signal DS. The mobility correction time is optimized in accordance with the white gradation. The second time mobility gradation is carried out only where the gradation is a gray gradation or the black gradation. In this instance, the control signal WS from which a waveform-shaped power supply pulse is sampled and the different control signal DS are used to determine the correction time. Consequently, high uniformity free from stripes over all gradations can be achieved by accurately controlling the mobility correction time for the white gradation which is sensitive to the correction time dispersion but adjusting not only the correction time for the first time correction but also the correction time for the second time correction for low gradation with which long correction time is required. Here, if the luminance gradation is represented by levels from 0 to 100, then the black display corresponds to a level lower than the level 30; the gray display corresponds to a level between the level 30 and the level 70; and the white level corresponds to a level between the level 70 and the level 100. Accordingly, where the luminance level is equal to or higher than 70, the mobility correction is carried out only once, but where the luminance level is lower than 70, the mobility correction is carried out twice. Particularly where the luminance level is lower than 70, the correction time for the second time correction is optimized in response to the gradation.

Figure 12:
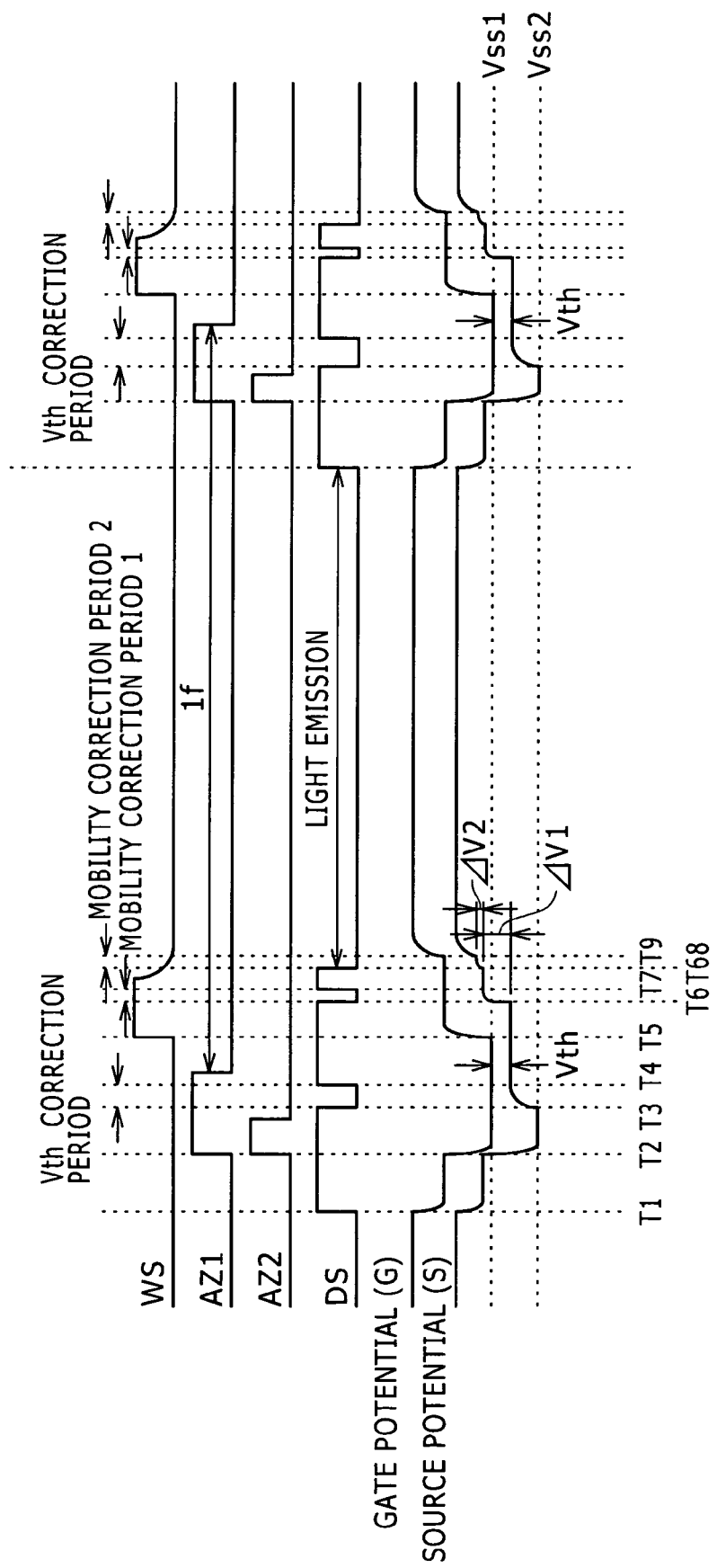
FIG. 12 is a timing chart illustrating operation of the display apparatus shown in FIGS. 1 and 2.

FIG. 12 illustrates a driving method according to the embodiment of the present invention. In order to facilitate understanding, the timing chart of FIG. 12 adopts the same representation as the timing chart of FIG. 4 according to the formerly developed driving method described hereinabove. First, at the timing T1 at which a field starts, the scanning line DS changes over from the low level to the high level. Consequently, the third switching transistor Tr4 is turned off to disconnect the drive transistor Trd from the third potential VDD. As a result, the light emission is stopped and a no-light emitting period is entered. Accordingly, at the timing T1, all transistors Tr1 to Tr4 are placed into an off state.

Then at the timing T2, the control signals AZ1 and AZ2 change over to the high level, and consequently, the switching transistors Tr2 and Tr3 are turned on. As a result, the gate G of the drive transistor Trd is connected to the first potential Vss1 and the source S of the drive transistor Trd is connected to the second potential Vss2. Here, the reference potentials Vss1 and Vss2 satisfy Vss1−Vss2>Vth, and they are set so as to satisfy Vss1−Vss2=Vgs>Vth in order to make preparations for Vth correction which is carried out later at the timing T3. In other words, the period T2-T3 corresponds to a reset period of the drive transistor Trd. Further, where the threshold voltage of the light emitting device EL is represented by VthEL, it is set so as to satisfy VthEL>Vss2. Consequently, a negative bias is applied to the light emitting device EL to place the light emitting device EL into a reversely biased state. This reversely biased state is required in order to normally carry out Vth correction operation and mobility correction operation which are to be carried out later.

At the timing T3, the control signal AZ2 is set to the low level, and then also the control signal DS is set to the low level immediately. Consequently, the transistor Tr3 is turned off and the transistor Tr4 is turned on. As a result, output current Ids flows into the pixel capacitor Cs to start Vth correction operation. At this time, the gate G of the drive transistor Trd is kept at the first potential Vss1, and the current Ids continues to flow until after the drive transistor Trd cuts off. When the drive transistor Trd cuts off, the source potential (S) of the drive transistor Trd becomes equal to Vss1−Vth. At the timing T4 after the drain current cuts off, the control signal DS is changed over back to the high level to turn off the switching transistor Tr4. Further, also the control signal AZ1 is changed over back to the low level to turn off the switching transistor Tr2 as well. As a result, the pixel capacitor Cs is kept and fixed to the threshold voltage Vth. In this manner, within the period from the timing T3 to the timing T4, the threshold voltage Vth of the drive transistor Trd is detected. This period T3-T4 is hereinafter referred to as Vth correction period.

After the Vth correction is carried out in this manner, at the timing T5, the control signal WS is changed over to the high level to turn on the sampling transistor Tr1 to write the image signal Vsig into the pixel capacitor Cs. The pixel capacitor Cs is sufficiently low when compared with the capacitance component Coled of the light emitting device EL. As a result, most of the image signal Vsig is written into the pixel capacitor Cs. More accurately, the difference Vsig−Vss1 of the image signal Vsig corresponding to Vss1 is written into the pixel capacitor Cs. Accordingly, the voltage Vgs between the gate G and the source S of the drive transistor Trd is equal to a level Vsig−Vss1+Vth which is the sum of the threshold voltage Vth detected and kept formerly and the difference Vsig−Vss1 sampled in the present operation cycle. If it is assumed that Vss1=0 V in order to simplify later description, then the gate/source voltage Vgs is given by Vsig+Vth as indicated in the timing chart of FIG. 12. Such sampling of the signal potential Vsig is carried out before the timing T9 at which the control signal WS returns to the low level. In other words, the period between the timings T5 and T9 corresponds to a sampling period.

At a timing prior to the timing T9 at which the sampling period, that is, the image signal writing period, ends, the control signal DS in the form of a pulse is applied to the scanning line DS. This pulse-formed control signal falls at the timing T6 and rises at the timing T7, and therefore is a negative pulse of a comparatively small pulse width. Within the mobility correction period T6-T7 from the timing T6 to the timing T7, the switching transistor Tr4 is turned on to define the mobility correction period. This mobility correction period T6-T7 depends only upon the pulse width of the scanning line DS and the dispersion little appears between pixels. The mobility correction period T6-T7 is accommodated in the image signal writing period T5-T9.

In this manner, the first time mobility correction is carried out within the correction time from the timing T6 to the timing T7. In other words, the mobility correction period T6-T7 is the mobility correction period 1. By applying the first time mobility correction, the source potential (S) of the drive transistor Trd rises by ΔV1. This mobility correction period 1 is optimized in accordance with a case wherein the signal potential of the image signal is high, that is, the white display.

Thereafter, the control signal DS changes over to the low level again to turn on the third switching transistor Tr4 at the timing T8. Thereafter, the control signal WS falls to turn off the sampling transistor Tr1 at the timing T9. The additional mobility correction is carried out within a period from the timing T8 to the timing T9. In other words, the period T8-T9 is the mobility correction period 2. The second time mobility correction is executed only when the signal potential of the image signal has the gray level or the black level. In particular, the falling edge waveform of the control signal WS is set such that, when the image signal has the gray level or the black level, the sampling transistor Tr1 is turned off at the timing T9 after the switching transistor is turned on first at the timing T8. By the second time mobility correction, the source potential (S) of the drive transistor Trd rises by ΔV2. As a result, when the gradation to be displayed is the gray or black gradation, the mobility correction value is optimized to ΔV1+ΔV2. On the other hand, when the gradation to be displayed is the white gradation, the mobility correction amount is ΔV1, and also in this instance, the mobility correction amount is in an optimized state.

Figure 13:
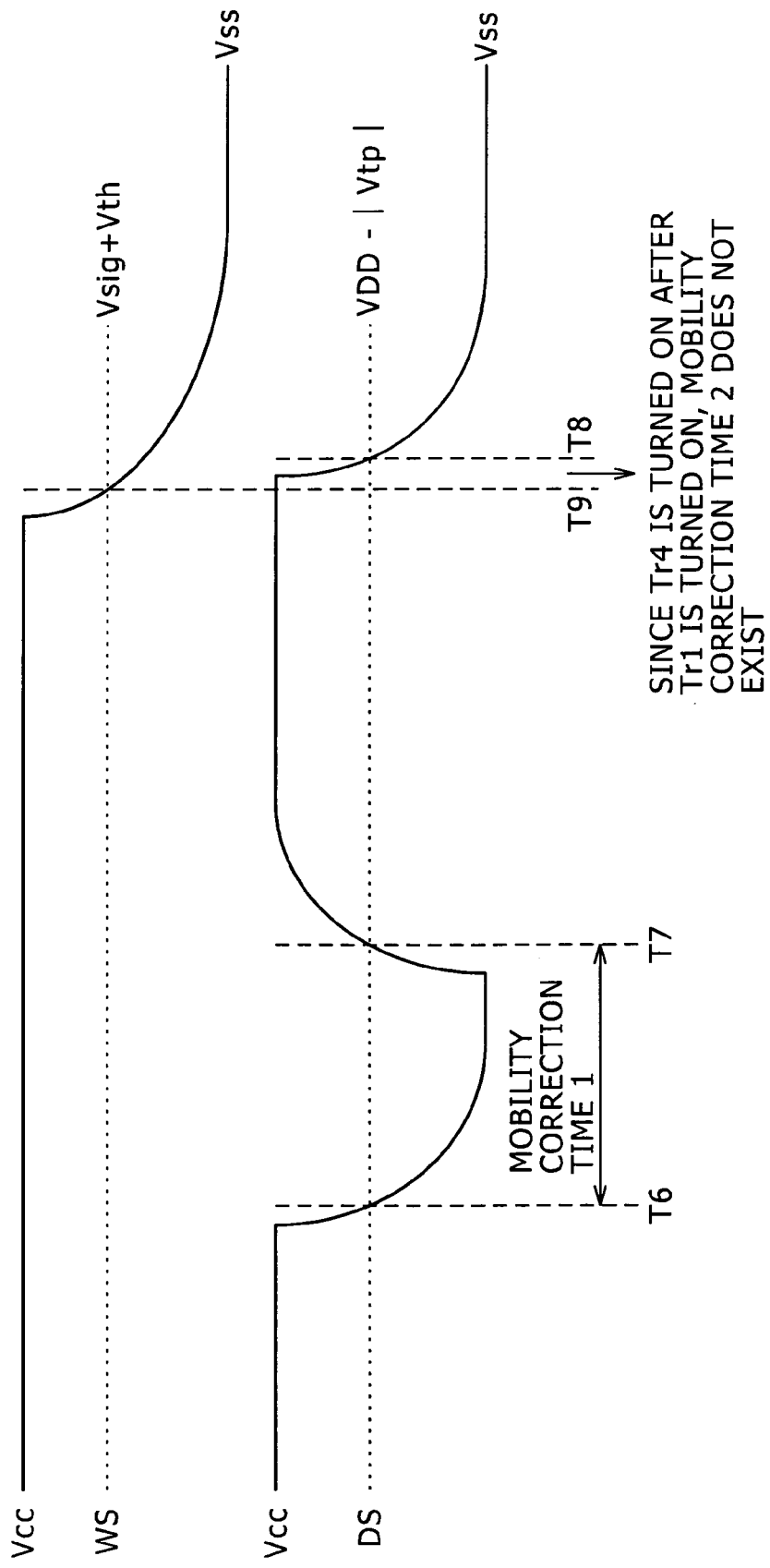
FIGS. 13 and 14 are waveform diagrams illustrating operation of the display apparatus shown in FIGS. 1 and 2.

FIG. 13 illustrates mobility correction operation when the image signal indicates the white gradation and illustrates waveforms of the control signals WS and DS on the same time axis. As seen in FIG. 13, when the image signal indicates the white gradation, although the first time mobility correction is carried out within the period T6-T7, the second time mobility correction is not carried out. In particular, where the white gradation is to be displayed, when the scanning line WS falls, the sampling transistor Tr1 turns off quickly at the timing T9. Thereafter, at the timing T8 at which the control signal DS falls and becomes lower than VDD−|Vtp|, the sampling transistor Tr1 turns on. Since the switching transistor Tr4 turns on after the sampling transistor Tr1 turns off, the second time mobility correction is not carried out. As a result, when the signal potential Vsig has a high level and the white gradation, the mobility correction time is determined by the mobility correction period T6-T7.

Figure 14:
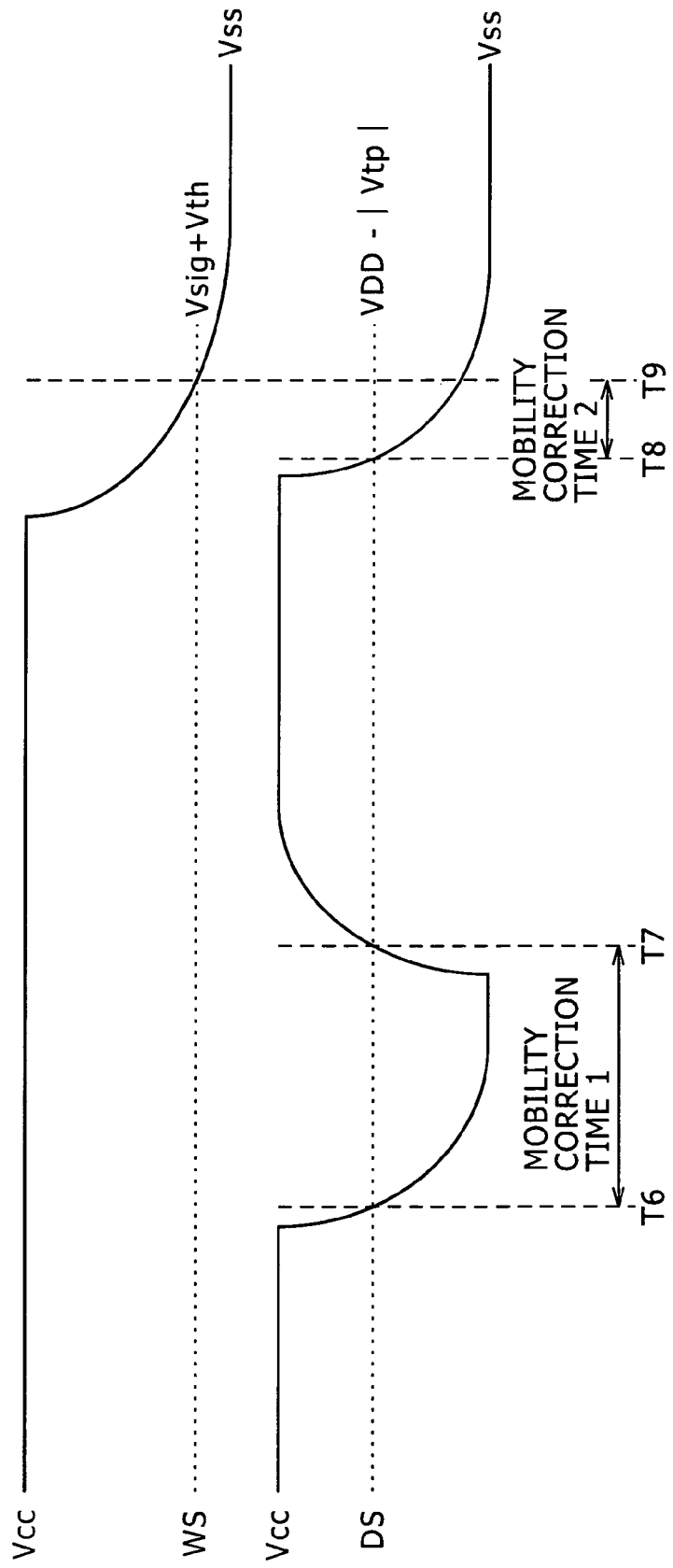

FIG. 14 illustrates mobility correction operation when the signal potential Vsig of the image signal is low and the gray gradation is to be displayed. When the gradation level is low, the mobility correction period T8-T9 for the second time mobility correction is added after the mobility correction period T6-T7 for the first time mobility correction. In the second time mobility correction, the control signal DS becomes lower than VDD−|Vtp| first at the timing T8 and the sampling transistor Tr1 is placed into an on state. Thereafter, the control signal WS becomes lower than Vsig−Vtn at the timing T9 and consequently the sampling transistor Tr1 is turned off. Since the timing T9 is shifted rearwardly when compared with the timing T8, the time within which both of the sampling transistor Tr1 and the switching transistor Tr4 exhibit an on state can be assured, and the second time mobility correction is carried out within this time. As can be apparently seen from FIG. 14, as the potential Vsig+Vtn drops, the timing T9 is shifted rearwardly by a greater amount and the mobility correction time 2 increases as much. In other words, as the luminance level drops, the mobility correction time increases, and optimum mobility correction can be carried out in accordance with the luminance level.

In the first time mobility correction, the mobility is controlled with the pulse width of the control signal DS. Since the DS pulse is outputted by simple inverter operation, a voltage as high as approximately 15 V is applied as the input voltage Vgs of a transistor which forms the inverter when the DS pulse is turned on and off, and this makes the characteristic dispersion appear less likely. Therefore, the dispersion in correction time at the white gradation can be suppressed. On the other hand, the second time mobility correction is carried out only at the gray or black gradation and has no influence on the white gradation. Since the necessary correction time is comparatively long at the gray or black gradation, optimum correction of the mobility dispersion can be carried out for each gradation by shaping the waveform of the power supply pulse and utilizing the shaped waveform to carry out mobility correction. Further, since the correction time is long at the low gradation, degradation in regard to stripe unevenness caused by the dispersion in correction time need not be taken into consideration. From the foregoing, it is possible to correct also the dispersion in correction time at the white gradation while appropriately correcting the mobility dispersion over all gradations thereby to obtain a screen image of high uniformity over all gradations.

Figure 15:
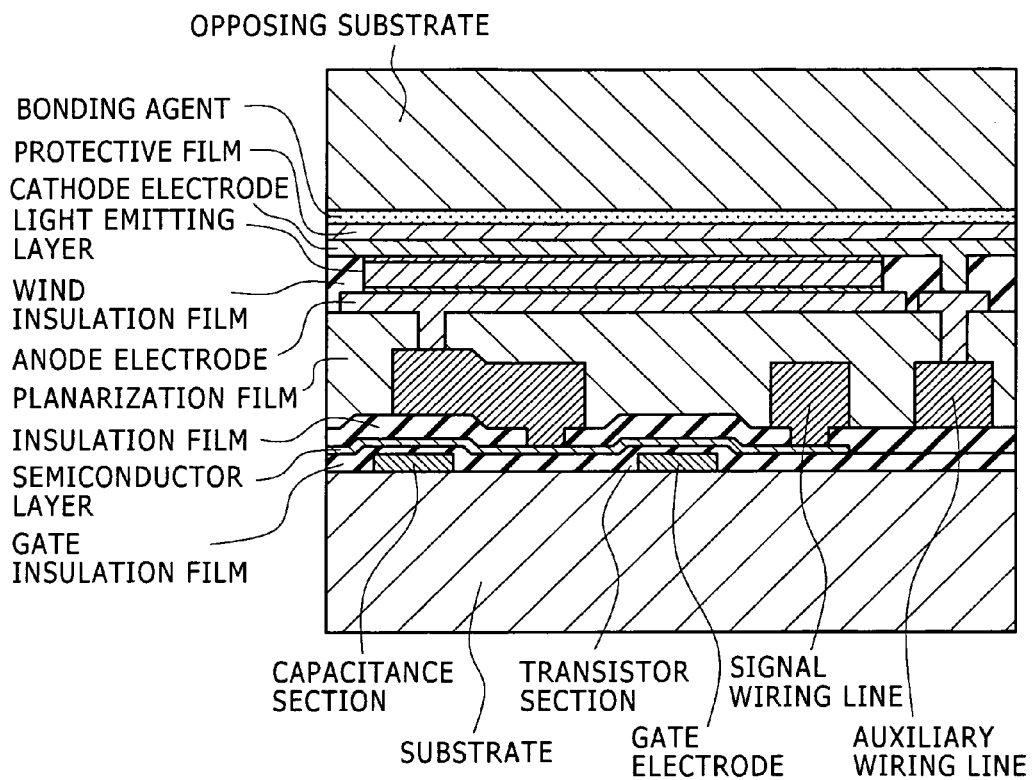
FIG. 15 is a sectional view showing a device configuration of the display apparatus to which the embodiment of the present invention is applied.

The display apparatus according to the embodiment of the present invention has such a thin film device configuration as shown in FIG. 15. FIG. 15 shows a schematic cross sectional structure of a pixel formed on an insulating substrate. Referring to FIG. 15, the pixel includes a transistor section including a plurality of thin film transistor (one TFT is shown in FIG. 15), a capacitance section including a holding capacitor and so forth, and a light emitting section including organic EL devices. The transistor section and the capacitance section are formed on a substrate by a TFT process, and the light emitting section of organic EL devices and so forth is formed on the transistor section and the capacitance section. A transparent opposing substrate is adhered to the light emitting section by a bonding agent to form a flat panel.

Figure 16:
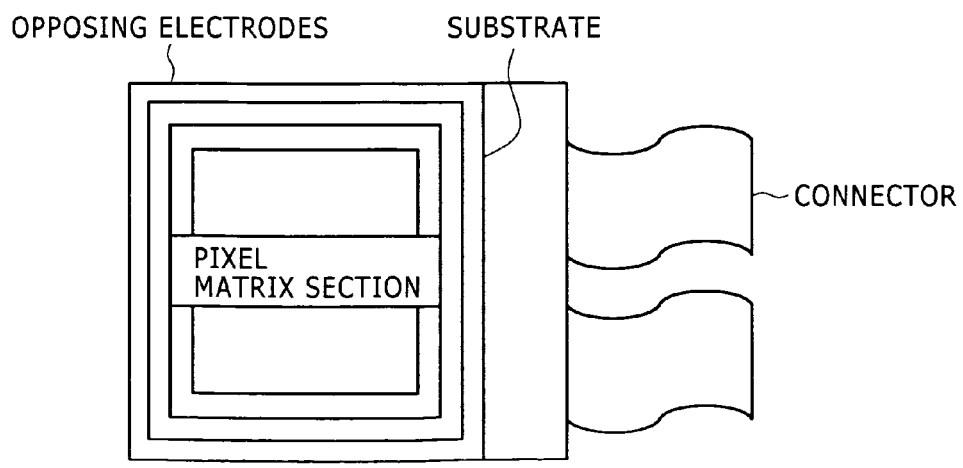
FIG. 16 is a plan view showing a module configuration of the display apparatus to which the embodiment of the present invention is applied.

The display apparatus according to the embodiment of the present invention includes such a display apparatus of the flat module type as seen in FIG. 16. Referring to FIG. 16, the display apparatus shown includes a pixel array section wherein pixels each including an organic EL device, thin film transistors, a thin film capacitor and so forth are integrated and formed in a matrix, for example, on an insulating substrate. Bonding agent is disposed in such a manner as to surround the pixel array section or pixel matrix section, and an opposing substrate of glass or the like is adhered to the pixel array section to form a display module. As occasion demands, a color filter, a protective film, a light blocking film and so forth may be provided on the transparent opposing substrate. For example, the display module may include flexible printed circuits (FPC) as connectors for inputting and outputting a signal to and from the pixel array section from and to the outside.

The display apparatus according to the embodiment of the present invention can be applied as a display apparatus for various electronic apparatus in various fields which display a driving signal inputted thereto or generated therein as an image such as, for example, a digital camera, a notebook type personal computer, a portable telephone set, and a video camera. In the following, several examples of an electronic apparatus to which such a display apparatus as described hereinabove is applied are described.

Figure 17:
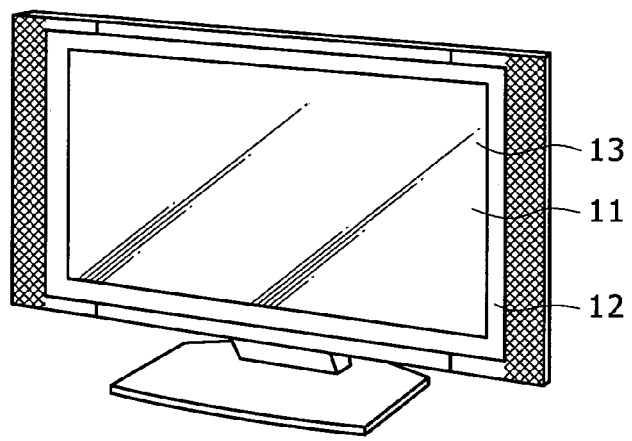
FIG. 17 is a perspective view showing a television set which includes the display apparatus to which the present invention is applied.

FIG. 17 shows a television set to which the embodiment of the present invention is applied. Referring to FIG. 17, the television set includes an image display screen section 11 composed of a front panel 12, a filter glass plate 13 and so forth. The image display screen section 11 is formed from a display apparatus to which the embodiment of the present invention is applied.

Figure 18:
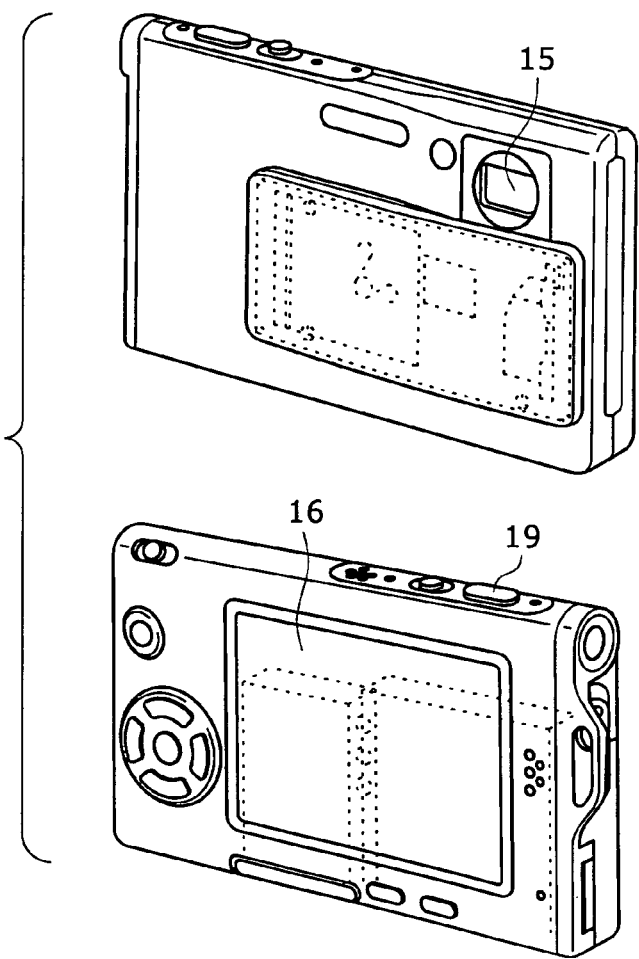
FIG. 18 is perspective views showing a digital still camera which includes the display apparatus to which the embodiment of the present invention is applied.

FIG. 18 shows a digital camera to which the embodiment of the present invention is applied, and particularly shows a perspective front elevational view and a perspective rear elevational view at upper and lower portions thereof. Referring to FIG. 18, the digital camera includes an imaging lens, a light emitting section 15 for emitting flashlight, a display section 16, a control switch, a menu switch, a shutter button 19 and so forth. The display section 16 is formed from a display apparatus to which the embodiment of the present invention is applied.

Figure 19:
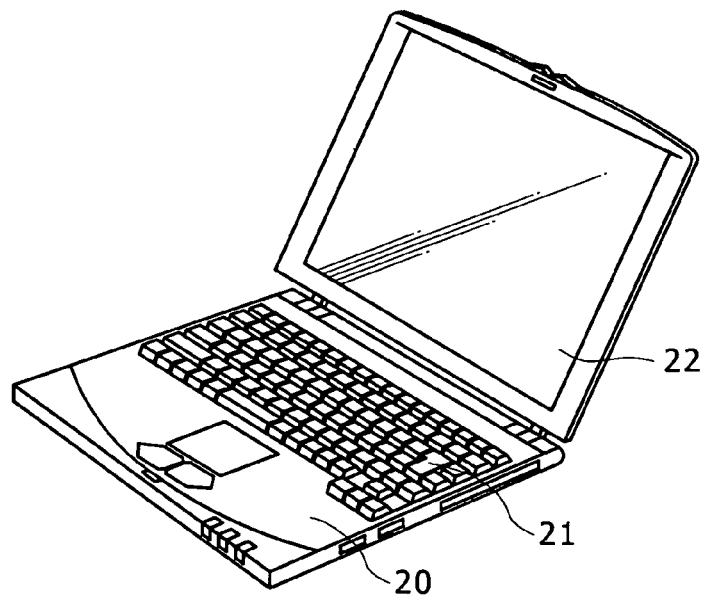
FIG. 19 is a perspective view showing a notebook type personal computer which includes the display apparatus to which the embodiment of the present invention is applied.

FIG. 19 shows a notebook type personal computer to which the embodiment of the present invention is applied. Referring to FIG. 19, the notebook type personal computer includes a keyboard 21 provided on a body 20 and operated in order to input a character or the like, and a display section 22 provided on a body cover for displaying an image. The display section 22 is formed from a display apparatus to which the embodiment of the present invention is applied.

Figure 20:
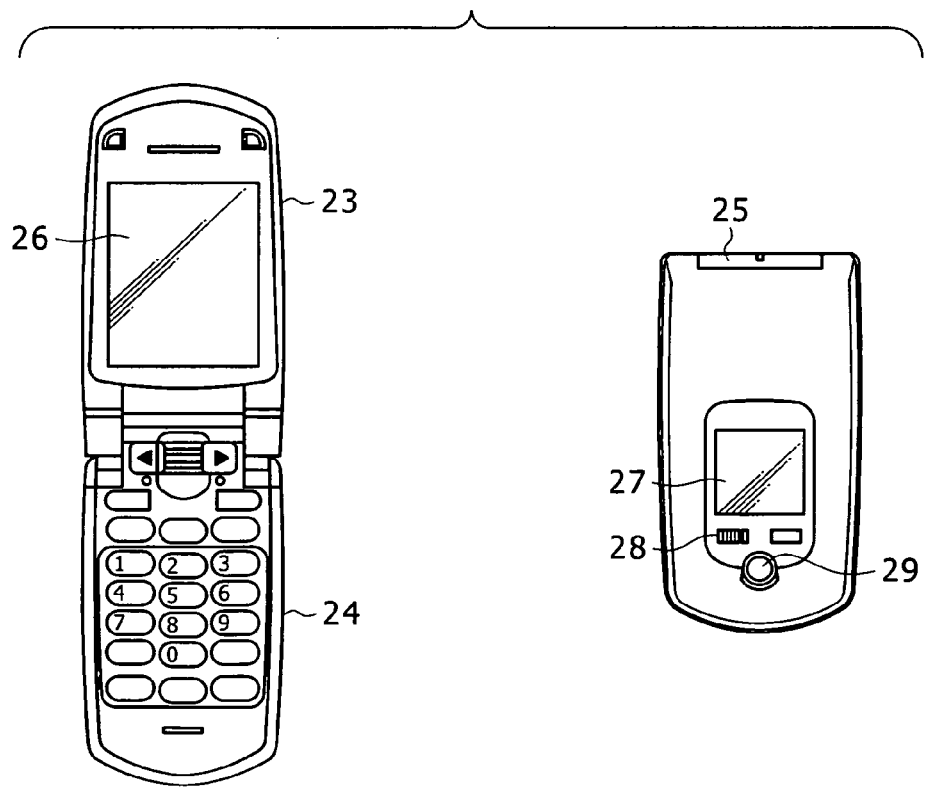
FIG. 20 is schematic views showing a portable terminal apparatus which includes the display apparatus to which the embodiment of the present invention is applied.

FIG. 20 shows a portable terminal apparatus to which the embodiment of the present invention is applied and shows the portable terminal in an open state and in a closed state on at left and right portions thereof, respectively. Referring to FIG. 20, the portable terminal apparatus includes an upper side housing 23, a lower side housing 24, a connection section 25 in the form of a hinge member, a display section 26, a sub display section 27, a picture light 28, a camera 29 and so forth. The display section 26 or the sub display section 27 is formed from a display apparatus to which the embodiment of the present invention is applied.

Figure 21:
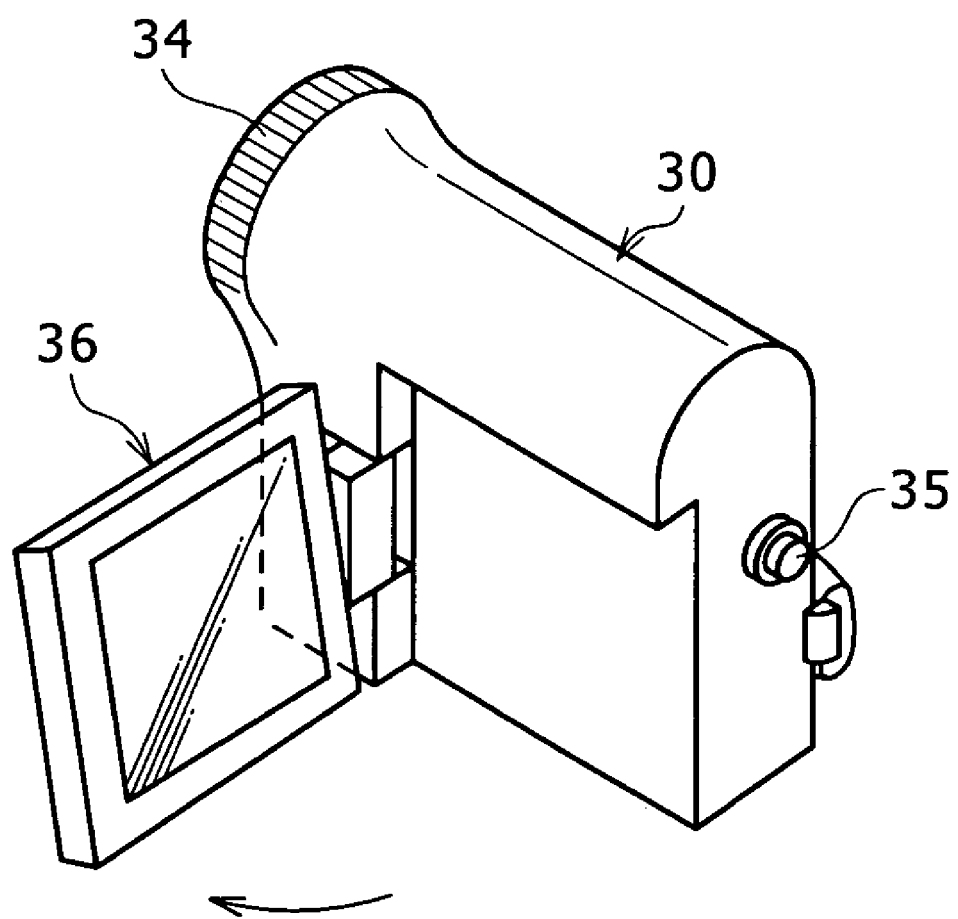
FIG. 21 is a perspective view showing a video camera which includes the display apparatus to which the embodiment of the present invention is applied.

FIG. 21 shows a video camera to which the embodiment of the present invention is applied. Referring to FIG. 21, the video camera includes a body section 30, and a lens 34 for picking up an image of an imaging object, a start/stop switch 35 for starting and stopping image pickup, a monitor 36 and so forth provided on a side face of the body section 30 which is directed forwardly. The monitor 36 is formed from a display apparatus to which the embodiment of the present invention is applied.

It should be understood by those skilled in the art that various modifications, combinations, sub-combinations and alterations may occur depending on design requirements and other factors insofar as they are within the scope of the appended claims or the equivalents thereof.

What is claimed is:
1. A display apparatus, comprising:
a pixel array section; and
a driving section configured to drive the pixel array section;
the pixel array section including a plurality of first and second scanning lines extending in the direction of a row, a plurality of signal lines extending in the direction of a column, a plurality of pixels disposed in a matrix at intersecting locations of the first and second scanning lines and the signal lines, and a plurality of power supply lines and ground lines configured to supply power to the pixels;

the driving section including a first scanner configured to successively supply a first control signal to the first scanning lines to line sequentially scan the pixels in a unit of a row, a second scanner configured to successively supply a second control signal to the second scanning lines in synchronism with the line sequential scanning, and a signal selector configured to supply an image signal to the signal lines in synchronism with the line sequential scanning, each of the pixels including a light emitting device, a sampling transistor, a drive transistor, a switching transistor, and a pixel capacitor, the sampling transistor being connected at the gate thereof to one of the first scanning lines, at the source thereof to one of the signal lines and at the drain thereof to the gate of the drive transistor, the drive transistor and the light emitting device being connected in series to form a current path between one of the power supply lines and one of the ground lines, the switching transistor being inserted in the current path with the gate thereof connected to one of the second scanning lines, the pixel capacitor being connected between the source and the gate of the drive transistor, the sampling transistor being placed into an on state in response to the first control signal supplied from the first scanning line to sample the signal potential of the image signal supplied from the signal line and retain the sampled signal potential into the pixel capacitor, the switching transistor being placed into an on state in response to the second control signal supplied from the second scanning line to place the current path into a conducting state, the drive transistor supplying driving current in response to the signal potential retained in the pixel capacitor to the light emitting device through the current path placed in the conducting state, the first scanner applying the first control signal to the first scanning line to turn on the sampling transistor to start sampling of the signal potential, whereafter the first scanner cancels the first control signal supplied to the first scanning line to turn off the sampling transistor, and the second scanner being configured to apply, within an image signal writing period after the sampling transistor is turned on until the sampling transistor is turned off, the second control signal in the form of a pulse to the second scanning line so that the switching transistor exhibits an on state within predetermined correction time, apply a first time correction for the mobility of the drive transistor to the signal potential retained in the pixel capacitor, then apply, if the signal potential of the image signal is not high, a second time correction for additional correction time at the last end of the image signal writing period to the signal potential retained in the pixel capacitor and prevent, if the signal potential of the image signal is high, application of the second time correction.

2. The display apparatus according to claim 1, wherein, around an off timing at which the first control signal applied to the first scanning line by the first scanner is canceled to turn off the sampling transistor, the second scanner applies the second control signal to the second scanning line at a predetermined timing to turn on the switching transistor, and the first scanner applies, when the sampling transistor is to be turned off at the off timing thereof, inclination to a falling edge waveform of the first control signal such that, when the signal potential of the image signal to be supplied to the signal line is not high, the off timing of the sampling transistor becomes lower than the on timing of the sampling transistor so that the second time correction may be applied, but when the signal potential of the image signal to be supplied to the signal line is high, the off timing precedes to the on timing so that the second time correction may not be applied.

3. The display apparatus according to claim 2, wherein the first scanner applies the inclination to the falling edge waveform of the first control signal such that, as the signal potential of the image signal drops, the additional correction time increases.

4. The display apparatus according to claim 2, wherein the first scanner includes an output buffer for outputting the first control signal, and the output buffer samples a falling edge waveform included in the power supply pulse supplied from an external pulse power supply and outputs the sampled falling edge waveform as the first control signal to the first scanning line.

5. A driving method for a display apparatus which includes a pixel array section and a driving section configured to drive the pixel array section;

the pixel array section including a plurality of first and second scanning lines extending in the direction of a row, a plurality of signal lines extending in the direction of a column, a plurality of pixels disposed in a matrix at intersecting locations of the first and second scanning lines and the signal lines, and a plurality of power supply lines and ground lines configured to supply power to the pixels;

the driving section including a first scanner configured to successively supply a first control signal to the first scanning lines to line sequentially scan the pixels in a unit of a row, a second scanner configured to successively supply a second control signal to the second scanning lines in synchronism with the line sequential scanning, and a signal selector configured to supply an image signal to the signal lines in synchronism with the line sequential scanning;

each of the pixels including a light emitting device, a sampling transistor, a drive transistor, a switching transistor, and a pixel capacitor;

the sampling transistor being connected at the gate thereof to one of the first scanning lines, at the source thereof to one of the signal lines and at the drain thereof to the gate of the drive transistor;

the drive transistor and the light emitting device being connected in series to form a current path between one of the power supply lines and one of the ground lines;

the switching transistor being inserted in the current path with the gate thereof connected to one of the second scanning lines;

the pixel capacitor being connected between the source and the gate of the drive transistor;

the driving method including the steps of:

placing the sampling transistor into an on state in response to the first control signal supplied from the first scanning line to sample the signal potential of the image signal supplied from the signal line and retain the sampled signal potential into the pixel capacitor;

placing the switching transistor into an on state in response to the second control signal supplied from the second scanning line to place the current path into a conducting state;

causing the drive transistor to supply driving current in response to the signal potential retained in the pixel capacitor to the light emitting device through the current path placed in the conducting state;

causing the first scanner to apply the first control signal to the first scanning line to turn on the sampling transistor to start sampling of the signal potential, whereafter the first scanner cancels the first control signal supplied to the first scanning line to turn off the sampling transistor; and causing the second scanner to apply, within an image signal writing period after the sampling transistor is turned on until the sampling transistor is turned off, the second control signal in the form of a pulse to the second scanning line so that the switching transistor exhibits an on state within predetermined correction time, apply a first time correction for the mobility of the drive transistor to the signal potential retained in the pixel capacitor, then apply, if the signal potential of the image signal is not high, a second time correction for additional correction time at the last end of the image signal writing period to the signal potential retained in the pixel capacitor and prevent, if the signal potential of the image signal is high, application of the second time correction.

6. An electronic apparatus comprising:

a display apparatus including;

a pixel array section; and a driving section configured to drive the pixel array section;

the pixel array section including a plurality of first and second scanning lines extending in the direction of a row, a plurality of signal lines extending in the direction of a column, a plurality of pixels disposed in a matrix at intersecting locations of the first and second scanning lines and the signal lines, and a plurality of power supply lines and ground lines configured to supply power to the pixels;

the driving section including a first scanner configured to successively supply a first control signal to the first scanning lines to line sequentially scan the pixels in a unit of a row, a second scanner configured to successively supply a second control signal to the second scanning lines in synchronism with the line sequential scanning, and a signal selector configured to supply an image signal to the signal lines in synchronism with the line sequential scanning, each of the pixels including a light emitting device, a sampling transistor, a drive transistor, a switching transistor, and a pixel capacitor, the sampling transistor being connected at the gate thereof to one of the first scanning lines, at the source thereof to one of the signal lines and at the drain thereof to the gate of the drive transistor, the drive transistor and the light emitting device being connected in series to form a current path between one of the power supply lines and one of the ground lines, the switching transistor being inserted in the current path with the gate thereof connected to one of the second scanning lines, the pixel capacitor being connected between the source and the gate of the drive transistor, the sampling transistor being placed into an on state in response to the first control signal supplied from the first scanning line to sample the signal potential of the image signal supplied from the signal line and retain the sampled signal potential into the pixel capacitor the switching transistor being placed into an on state in response to the second control signal supplied from the second scanning line to place the current path into a conducting state, the drive transistor supplying driving current in response to the signal potential retained in the pixel capacitor to the light emitting device through the current path placed in the conducting state, the first scanner applying the first control signal to the first scanning line to turn on the sampling transistor to start sampling of the signal potential, whereafter the first scanner cancels the first control signal supplied to the first scanning line to turn off the sampling transistor; and the second scanner being configured to apply, within an image signal writing period after the sampling transistor is turned on until the sampling transistor is turned off, the second control signal in the form of a pulse to the second scanning line so that the switching transistor exhibits an on state within predetermined correction time, apply a first time correction for the mobility of the drive transistor to the signal potential retained in the pixel capacitor, then apply, if the signal potential of the image signal is not high, a second time correction for additional correction time at the last end of the image signal writing period to the signal potential retained in the pixel capacitor and prevent, if the signal potential of the image signal is high, application of the second time correction.

* * * * *